US011222696B1

(12) United States Patent
Asnaashari et al.

(10) Patent No.: US 11,222,696 B1
(45) Date of Patent: *Jan. 11, 2022

(54) COMPUTING MEMORY ARCHITECTURE

(71) Applicant: Crossbar, Inc., Santa Clara, CA (US)

(72) Inventors: Mehdi Asnaashari, Danville, CA (US); Hagop Nazarian, San Jose, CA (US); Christophe Sucur, San Jose, CA (US); Sylvain Dubois, San Francisco, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/917,261

(22) Filed: Jun. 30, 2020

Related U.S. Application Data

(63) Continuation of application No. 16/144,771, filed on Sep. 27, 2018, now Pat. No. 10,699,785.
(Continued)

(51) Int. Cl.
*G11C 11/00* (2006.01)
*G11C 13/00* (2006.01)
(Continued)

(52) U.S. Cl.
CPC .......... *G11C 13/0069* (2013.01); *G06F 17/16* (2013.01); *G11C 7/18* (2013.01);
(Continued)

(58) Field of Classification Search
CPC ......... G11C 13/0069; G11C 7/18; G11C 8/12; G11C 29/42; G11C 29/4401; G11C 8/14;
(Continued)

(56) References Cited

U.S. PATENT DOCUMENTS 6,163,481 A 12/2000 Yamada et al.
7,095,642 B1 8/2006 Parent et al.
(Continued)

FOREIGN PATENT DOCUMENTS

WO 2017131792 8/2017

OTHER PUBLICATIONS

Examination Report for corresponding Taiwanese Patent Application No. 107134397 dated Oct. 7, 2019, 18 pages long.
(Continued)

*Primary Examiner* — Uyen Smet
(74) *Attorney, Agent, or Firm* — Wegman Hessler

(57) ABSTRACT

Provided herein is a computing memory architecture. The non-volatile memory architecture can comprise a resistive random access memory array comprising multiple sets of bitlines and multiple wordlines, a first data interface for receiving data from an external device and for outputting data to the external device, and a second data interface for outputting data to the external device. The non-volatile memory architecture can also comprise programmable processing elements connected to respective sets of the multiple sets of bitlines of the resistive random access memory array, and connected to the data interface. The programmable processing elements are configured to receive stored data from the resistive random access memory array via the respective sets of bitlines or to receive external data from the external device via the data interface, and execute a logical or mathematical algorithm on the external data or the stored data and generate processed data.

19 Claims, 17 Drawing Sheets

Related U.S. Application Data

(60) Provisional application No. 62/566,001, filed on Sep. 29, 2017.

(51) Int. Cl.

| | | |
|---|---|---|
| *G11C 8/12* | (2006.01) | |
| *G11C 29/42* | (2006.01) | |
| *G11C 29/44* | (2006.01) | |
| *G11C 8/14* | (2006.01) | |
| *G06F 17/16* | (2006.01) | |
| *G11C 7/18* | (2006.01) | |
| *G11C 29/04* | (2006.01) | |

(52) U.S. Cl.
CPC .............. *G11C 8/12* (2013.01); *G11C 8/14* (2013.01); *G11C 29/42* (2013.01); *G11C 29/4401* (2013.01); *G11C 13/003* (2013.01); *G11C 13/004* (2013.01); *G11C 13/0023* (2013.01); *G11C 13/0026* (2013.01); *G11C 13/0028* (2013.01); *G11C 13/0097* (2013.01); *G11C 2029/0411* (2013.01); *G11C 2213/71* (2013.01); *G11C 2213/75* (2013.01); *G11C 2213/79* (2013.01)

(58) Field of Classification Search
CPC .............. G11C 13/003; G11C 2213/75; G11C 2213/79; G11C 13/0026; G11C 13/0028; G11C 13/0097; G11C 13/0023; G11C 13/004; G11C 2029/0411; G11C 2213/71; G06F 17/16
See application file for complete search history.

(56) References Cited

U.S. PATENT DOCUMENTS

| | | | |
|---|---|---|---|
| 9,306,851 B1 | 4/2016 | Gazit | |
| 9,524,210 B1 | 12/2016 | Asnaashari | |
| 10,825,512 B1* | 11/2020 | Baker, Jr. | ............. G06N 3/0635 |
| 2003/0179623 A1 | 9/2003 | Inoue | |
| 2008/0025132 A1 | 1/2008 | Fasoli et al. | |
| 2008/0025134 A1 | 1/2008 | Scheuerlein et al. | |
| 2012/0003039 | 2/2012 | Zhu et al. | |
| 2013/0054886 A1 | 2/2013 | Eshraghian et al. | |
| 2013/0132685 A1 | 5/2013 | Vogelsang et al. | |
| 2014/0071761 A1 | 3/2014 | Sharon | |
| 2014/0133211 A1 | 5/2014 | Nazarian et al. | |
| 2014/0293674 A1 | 10/2014 | Johnson | |
| 2015/0003156 A1 | 1/2015 | Berckmann et al. | |
| 2015/0009745 A1 | 1/2015 | Nguyen et al. | |
| 2016/0189775 A1 | 6/2016 | Buchanan | |
| 2016/0232951 A1* | 8/2016 | Shanbhag | ................ G11C 7/16 |
| 2016/0260775 A1 | 9/2016 | Takaki | |
| 2016/0359916 A1 | 12/2016 | Kim | |
| 2017/0032839 A1 | 2/2017 | Bertin et al. | |
| 2017/0300415 A1 | 10/2017 | Bonen | |
| 2018/0075893 A1* | 3/2018 | Matsuoka | .......... G11C 13/0069 |
| 2018/0095930 A1 | 4/2018 | Lu et al. | |
| 2018/0114569 A1 | 4/2018 | Buchanan | |
| 2019/0206460 A1 | 7/2019 | Il | |

OTHER PUBLICATIONS

Notice of Allowance for corresponding U.S. Appl. No. 16/368,156 dated Mar. 26, 2020 9 pages long.

Notice of Allowance for corresponding U.S. Appl. No. 16/144,771 dated Feb. 20, 2020 8 pages long.

Notification of International Preliminary Report on Patentability for corresponding International Patent Application No. PCT/US2018/053544 dated Jan. 17, 2020, 18 pages long.

International Search Report and Written Opinion for corresponding International Patent Application No. PCT/US2018/053544 dated Dec. 4, 2018, 12 pages long.

Notice of Allowance for corresponding Taiwan Patent Application No. 107134397 dated May 13, 2020, 4 pages long.

Non-final Office Action for corresponding U.S. Appl. No. 16/398,943 dated Oct. 15, 2020, 22 pages long.

Final Office Action for U.S. Appl. No. 16/398,943 dated Mar. 19, 2021, 20 page long.

Non-final Office Action received for U.S. Appl. No. 16/144,765 dated May 21, 2020, 10 pages long.

Final Office Action received for U.S. Appl. No. 16/144,765 dated Dec. 11, 2020, 15 pages long.

Non-Final Office Action received for U.S. Appl. No. 16/428,173 dated May 28, 2020, 17 pages long.

Final Office Action received for U.S. Appl. No. 16/428,173 dated Dec. 23, 2020, 16 pages long.

Panel Decision received for U.S. Appl. No. 16/428,173 dated May 7, 2021, 2 pages long.

Non-Final Office Action for U.S. Appl. No. 16/144,771 dated Oct. 29, 2019 14 pages long.

Notice of Allowance for U.S. Appl. No. 16/144,765 dated May 19, 2021, 17 pages long.

Notice of Allowance for U.S. Appl. No. 16/398,943 dated Sep. 20, 2021, 9 pages long.

Notice of Allowance for U.S. Appl. No. 16/428,173 dated Oct. 25, 2021, 9 pages long.

* cited by examiner

COMPUTING MEMORY ARCHITECTURE

CROSS-REFERENCE TO RELATED APPLICATIONS

This application is a continuation of U.S. patent application Ser. No. 16/144,771 filed Sep. 27, 2018, now U.S. Pat. No. 10,699,785 entitled "COMPUTING MEMORY ARCHITECTURE", which claims the benefit of U.S. Provisional Application Ser. No. 62/566,001, filed Sep. 29, 2017, and entitled "LOGIC, COMPUTING AND MANAGEMENT APPLICATIONS FOR RESISTIVE MEMORY DEVICES", the entirety of which is expressly incorporated herein by reference.

TECHNICAL FIELD

This disclosure generally relates to an architecture for an electronic memory having inline processing capability.

BACKGROUND

Resistive-switching memory represents a recent innovation within the field of integrated circuit technology. While much of resistive-switching memory technology is in the development stage, various technological concepts for resistive-switching memory have been demonstrated by the inventor(s) and are in one or more stages of verification to prove or disprove associated theories or techniques. The inventor(s) believe that resistive-switching memory technology shows compelling evidence to hold substantial advantages over competing technologies in the semiconductor electronics industry.

Over time, advancement in technology has provided an increase in a number of semiconductor devices, such as transistors, that can be fabricated on a given geometric area of a semiconductor chip. An implication of increasing the number of semiconductor devices is increasing memory capacity and processing power for the semiconductor chip and associated electronic devices.

Models for resistive-switching memory proposed by the inventor(s) utilize two-terminal structures. Two-terminal memory technology is contrasted, for instance, with gate-controlled transistors in which conductivity between two terminals is mediated by a third terminal, called a gate terminal. Two-terminal memory devices can differ from three terminal devices in function as well as structure. For instance, some two-terminal devices can be constructed between a pair of conductive contacts, as opposed to having a third terminal that is adjacent to a set of conductive terminals. Rather than being operable through a stimulus applie7 to the third terminal, two-terminal memory devices can be controlled by applying a stimulus at one or both of the pair of conductive contacts. The inventor(s) of the present disclosure is further aware of a variety of two-terminal memory technologies, such as phase-change memory, magneto-resistive memory, conductive-bridging memory, as well as others.

While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

As models of resistive memory technology are tested and results obtained, the results are speculatively extrapolated to memory devices in which resistive memory replaces a conventional memory. For instance, the assignee of the present invention has conducted research related to software models of memory arrays comprising resistive memory instead of complementary metal-oxide semiconductor (CMOS) NAND or NOR memory. Software projections suggest that two-terminal memory arrays can provide significant benefits for electronic devices, including reduced power consumption, higher memory density, advanced technology nodes, or improved performance, among others.

Drawing from existing research, the inventor(s) endeavors to discover applications where two-terminal memory can provide real-world benefits for electronic devices.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

An aspect relates to a non-volatile memory architecture that can comprise a resistive random access memory array comprising multiple sets of bitlines and multiple wordlines. The non-volatile memory architecture can also comprise a first data interface for receiving data from an external device and for outputting data to the external device. Further, the non-volatile memory architecture can also comprise a second data interface for outputting data to the external device. The second data interface comprises a second bandwidth different than the first bandwidth.

According to an example, the second data interface selects a subset of bitlines from the multiple sets of bitlines. Further to this example, the first data interface selects all bitlines from the multiple sets of bitlines.

According to some implementations, the non-volatile memory architecture can comprise programmable processing elements connected to respective sets of the multiple sets of bitlines of the resistive random access memory array. The programmable processing elements can be configured to receive stored data from the resistive random access memory array and via respective sets of bitlines or to receive external data from the external device. Further, the programmable processing elements can execute a logical or mathematical algorithm on the external data or the stored data and generate processed data.

According to an implementation, the non-volatile memory architecture can further comprise read sense amps connected the multiple sets of bitlines. The read sense amps can be configured to acquire the stored data from memory cells of the resistive random access memory array.

In an implementation, the programmable processing elements can be located between the data interface and the resistive random access memory array. The programmable processing elements can be physically connected with the multiple sets of bitlines of the resistive random access memory array.

According to some implementations, a first processing element of the programmable processing elements can be associated with a first set of the bitlines and a second processing element of the processing elements can be associated with a second set of the bitlines. In an implementation, a first quantity of bitlines in the first set of the bitlines can be the same as a second quantity of the bitlines in the second set of the bitlines. In an alternative implementation, a first quantity of bitlines in the first set of the bitlines can be different than a second quantity of the bitlines in the second set of the bitlines.

In another implementation, the non-volatile memory architecture can comprise correction code decoders associated with the programmable processing elements. Further to this implementation, the correction code decoders can be configured to identify and correct an error bit in the stored data in conjunction with the programmable processing elements receiving the stored data from the resistive random access memory array.

According to some implementations, the resistive random access memory array can comprise a wordline start pointer and a wordline stop pointer. Further to this implementation, the wordline start pointer and the wordline stop pointer can be configured to identify a subset of data stored at the resistive random access memory array as the stored data. Further, the wordline start pointer and the wordline stop pointer can facilitate transfer of only the subset of data to the programmable processing elements.

Another aspect relates to a method that can comprise receiving, at programmable processing elements of a non-volatile memory, stored data from a resistive random access memory array or external data from an external device via a data interface. The resistive random access memory array can comprise multiple sets of bitlines and multiple wordlines. The stored data can be received over respective sets of bitlines. The method can also comprise generating, by the programmable processing elements, processed data based on an execution of a logical or mathematical algorithm on the external data or the stored data. The programmable processing elements can perform the execution in parallel.

The following description and the drawings set forth certain illustrative aspects of the specification. These aspects are indicative, however, of but a few of the various ways in which the principles of the specification can be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure can be practiced without these specific details, or with other methods, components, materials, etc. In other instances, well-known structures and devices are shown in block diagram form to facilitate describing the subject disclosure.

DETAILED DESCRIPTION

Introduction

Figure 1:
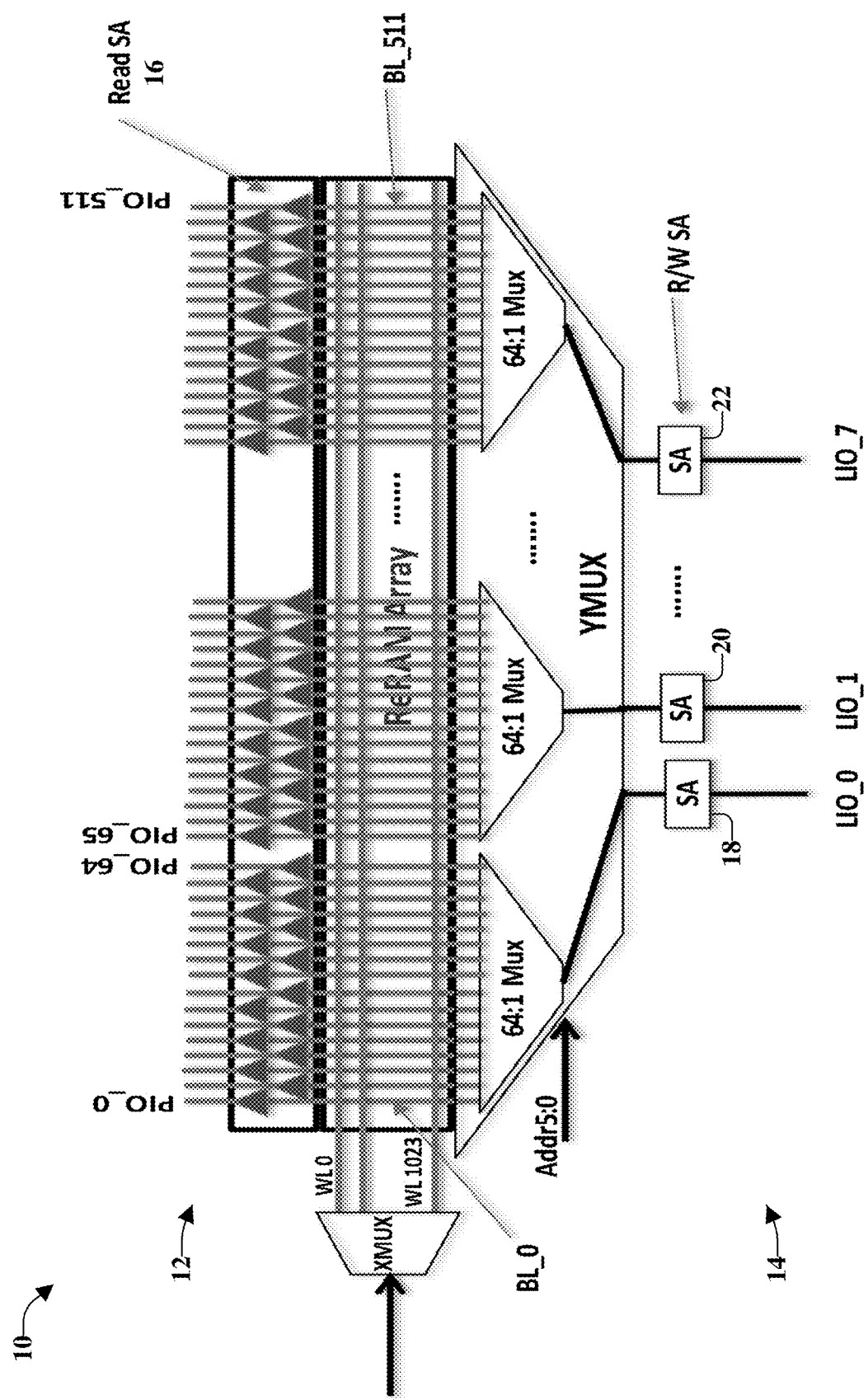
FIG. 1 illustrates a schematic diagram of an example computing memory architecture that comprises a memory array according to an embodiment of the subject disclosure

As its name implies, a two-terminal memory device has two terminals or electrodes. Herein, the terms "electrode" and "terminal" are used interchangeably. Generally, a first electrode of two-terminal memory is referred to as a "top electrode" (TE) and a second electrode of the two-terminal memory is referred to as a "bottom electrode" (BE), although it is understood that electrodes of a two-terminal memory device can be according to any suitable arrangement, including a horizontal arrangement in which components of a memory cell are (substantially) side-by-side rather than overlying one another and including an oblique arrangement in which a memory cell stack is constructed at non-right angles to an underlying substrate. Situated between the TE and BE of a two-terminal memory device is typically an interface layer sometimes referred to as a switching layer, a resistive switching medium (RSM) or a resistive switching layer (RSL). When incorporating a RSM, the two-terminal memory device can be referred to as a (two-terminal) resistive switching device. In at least some disclosed embodiments, a non-volatile resistive switching device can be provided as a data storage device, and a volatile resistive switching device can be provided in series with the non-volatile resistive switching device to serve as an access device (also referred to as a selector device) for the data storage device. In such embodiments, the access device can mitigate current leakage in a 1 transistor—many resistive memory cell (1TnR) architecture, among other benefits.

One example of a resistive switching memory is a filamentary resistive memory cell. Composition of filamentary resistive memory cells, generally speaking, can vary per device with different components selected to achieve desired characteristics (e.g., volatility/non-volatility, on/off current ratio, switching time, read time, memory durability, program/erase cycle, and so on). One example of a filamentary resistive memory cell can comprise: a conductive layer, e.g., metal, metal-alloy (including, for instance, a metal-metal alloy such as TiW and others, and various suitable a metal-nonmetal alloys), metal-nitride (e.g., comprising TiN, TaN, or other suitable metal-nitride compound), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.), a RSL and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer.

A RSL (which can also be referred to in the art as a resistive switching media (RSM)) can comprise, e.g., an undoped amorphous Si-containing layer, a semiconductor layer having intrinsic characteristics, a silicon nitride (e.g., SiN, $Si_3N_4$, $SiN_x$ where x is a positive number, etc.), a Si sub-oxide (e.g., SiOx wherein x has a value between 0.1 and 2), a Si sub-nitride, a metal oxide, a metal nitride, a non-stoichiometric silicon compound, a silicon and nitrogen containing material, a metal and nitrogen containing material, and so forth. Other examples of amorphous and/or non-stoichiometric materials suitable for the RSL could include $Si_XGe_YO_Z$ (where X, Y and Z are respective suitable positive numbers), a silicon oxide (e.g., $SiO_N$, where N is a suitable positive number), a silicon oxynitride, an undoped amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) other suitable oxides and so forth, a nitride (e.g., AiN, SiN), e.g., or the like, or a suitable combination thereof.

In some embodiments, a RSL employed as part of a non-volatile memory device (non-volatile RSL) can include a relatively large number (e.g., compared to a volatile selector device) of material voids or defects to trap neutral metal particles (at least at low voltage) within the RSL. The relatively large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects. Having few particle-trapping voids/defects, a conductive filament formed in the volatile RSL can be quite thin, and unstable absent a suitably high external stimulus (e.g., an electric field, voltage, current, joule heating, or a suitable combination thereof). Moreover, in the context of a volatile selector device, the neutral metal particles can be selected to have high surface energy, and good diffusivity within the volatile RSL. This leads to a conductive filament that can form rapidly in response to a suitable stimulus, but also deform quite readily, e.g., in response to the external stimulus dropping below a deformation magnitude. Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as compounds, oxides e.g., nitrides e.g., alloys, or combinations of the foregoing or similar materials can be employed for the active metal-containing layer in some aspects of the subject disclosure. Further, a non-stoichiometric compound, such as a non-stoichiometric metal oxide or metal nitride (e.g., AlOx, AlNx, CuOx, CuNx, AgOx, AgNx, and so forth, where x is a suitable positive number $0<x<2$, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal nitride selected from the group consisting of: TiNx, TaNx, AlNx, CuNx, WNx and AgNx, where x is a positive number. In a further embodiment(s), the active metal layer can comprise a metal oxide selected from the group consisting of: TiOx, TaOx, AlOx, CuOx, WOx and AgOx. In yet another embodiment(s), the active metal layer can comprise a metal oxi-nitride selected from the group consisting of: TiOaNb, AlOaNb, CuOaNb, WOaNb and AgOaNb, where a and b are positive numbers. The disclosed filamentary resistive switching device can further comprise a switching layer comprising a switching material selected from the group consisting of: SiOy, AlNy, TiOy, TaOy, AlOy, CuOy, TiNx, TiNy, TaNx, TaNy, SiOx, SiNy, AlNx, CuNx, CuNy, AgNx, AgNy, TiOx, TaOx, AlOx, CuOx, AgOx, and AgOy, where x and y are positive numbers, and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a metal compound and a resistive switching layer. In one alternative embodiment of this example, the particle donor layer comprises a metal nitride: MNx, e.g., AgNx, TiNx, AlNx, etc., and the resistive switching layer comprises a metal nitride: MNy, e.g., AgOy, TiOy, AlOy, and so forth, where y and x are positive numbers, and in some cases y is larger than x. In an alternative embodiment of this example, the particle donor layer comprises a metal oxide: MOx, e.g., AgOx, TiOx, AlOx, and so on, and the resistive switching layer comprises a metal oxide: MOy, e.g., AgOy, TiOy, AlOy, or the like, where y and x are positive numbers, and in some cases y is larger than x. In yet another alternative, the metal compound of the particle donor layer is a MNx (e.g., AgNx, TiNx, AlNx, etc.), and the resistive switching layer is selected from a group consisting of MOy (e.g., AgOx, TiOx, AlOx, etc.) and SiOy, where x and y are typically non-stoichiometric values.

As utilized herein, variables x, a, b, and so forth representative of values or ratios of one element with respect to another (or others) in a compound can have different values suitable for respective compounds, and are not intended to denote a same or similar value or ratio among the compounds. Some details pertaining to embodiments of the subject disclosure similar to the foregoing example(s) can be found in the following U.S. patent applications that are licensed to the assignee of the present application for patent: application Ser. No. 13/875,541 filed Oct. 19, 2007 and application Ser. No. 12/575,921 filed Oct. 8, 2009; each of the foregoing patent applications are hereby incorporated by reference herein in their respective entireties and for all purposes.

As mentioned above, applying a program voltage (also referred to as a "program pulse") to one of the electrodes of the two-terminal memory can cause a conductive filament to form in an interface layer (e.g., a RSL). By convention and as generally described herein, the TE receives the program pulse and the BE is grounded (or held at lower voltage or opposite polarity compared to the program pulse), but such is not intended to be limiting for all embodiments. Conversely, applying an "erase pulse" to one of the electrodes (generally a pulse of opposite polarity as the program pulse or to the opposite electrode as the program pulse) can break continuity of the filament, e.g., by driving the metal particles or other material that forms the filament back toward the active metal source. Properties of this conductive filament as well as its presence or absence affect the electrical characteristics of the two-terminal memory cell such as, for example, lowering the resistance and/or increasing conductance across the two terminals when the conductive filament is present as opposed to when not present.

Following program or erase pulses, a read pulse can be asserted. This read pulse is typically lower in magnitude relative to program or erase pulses and typically insufficient to affect the conductive filament and/or change the state of the two-terminal memory cell. By applying a read pulse to one of the electrodes of the two-terminal memory, a measured current (e.g., $I_{on}$) can be indicative of the conductive state of the two-terminal memory cell. For example, when the conductive filament has been formed (e.g., in response to application of a program pulse), the conductance of the cell is greater than otherwise and the measured current (e.g., $I_{on}$) reading in response to the read pulse will be greater. On the other hand, when the conductive filament is removed (e.g., in response to application of an erase pulse), the resistance of the cell is high because the interface layer has a relatively high electrical resistance, so the conductance of the cell is lower and the measured current (e.g., $I_{off}$) reading in response to the read pulse will be lower. By convention, when the conductive filament is formed, the memory cell is said to be in the "on-state" with a high conductance. When the conductive filament is not extant, the memory cell is said to be in the "off-state." A memory cell being in the on-state or the off-state can be logically mapped to binary values such as, e.g., "1" and "0." It is understood that conventions used herein associated with the state of the cell or the associated logical binary mapping are not intended to be limiting, as other conventions, including an opposite convention can be employed in connection with the disclosed subject matter. Techniques detailed herein are described and illustrated in connection with single-level cell (SLC) memory, but it is understood that the disclosed techniques can also be utilized for multi-level cell (MLC) memory in which a single memory cell can retain a set of measurably distinct states that represent multiple bits of information.

By mapping digital information to non-volatile resistance states of a two-terminal memory cell, digital information can be stored at such device. An electronic device containing many of these two-terminal memory cells can likewise store significant quantities of data. High density arrays are configured to contain as many memory cells as possible for a given area of chip space, thereby maximizing data storage capacity of a memory chip, or system-on-chip device.

For two-terminal memory formed at intersections of metal lines within a wafer (e.g., a crossbar array), the inventor(s) of the subject disclosure is cognizant of two general conventions for arrangement of the memory cells. A first convention is the 1T1R memory array, in which each memory cell is isolated from electrical effects (e.g., current, including leak path current(s)) of surrounding circuitry by an associated transistor. A second convention is the 1TnR memory array (n being a positive number greater than one), where a group of multiple memory cells is isolated from electrical effects of surrounding circuitry by one (or more) transistors. In the 1T1R context, individual memory cells can be configured to have high current suppression between memory cells, significantly reducing leakage path currents for the 1T1R memory array. In the 1TnR context, individual memory cells can include a selector device (e.g., a volatile, two-terminal filamentary resistance device), to suppress leakage path currents among the group of multiple memory cells isolated by the one (or more) transistors.

Example Computing Memory Architecture

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure can be practiced without these specific details, or with other methods, components, materials, etc. In other instances, well-known structures and devices are shown in block diagram form to facilitate describing the subject disclosure.

Referring initially to FIG. 1, illustrated is a schematic diagram of an example computing memory architecture 10 that comprises a memory array 11 according to an embodiment of the subject disclosure. The example of FIG. 1 is an 8-bit logical interface and 512-bit physical interface; 64 KB (512K bits) memory array.

The computing memory architecture 10 can comprise memory array 11 that comprises two interfaces, namely, a physical interface 12 and a logical interface 14. For example, the physical interface 12 can be a physical access mode. The physical interface 12 can be a wide interface (e.g., high throughput/bandwidth (BW)). For example, the physical interface 12 can be 512 bits. The physical interface 12 can use small, low power read only sense amps (SAs) 16, illustrated by the rows of triangles at the top of FIG. 1. Outputs of the read only sense amps 16 are illustrated as Physical 10 (e.g., PIO_0 through PIO_511). The read only sense amps 16 can be a large number of read sense amps. Further, the read only sense amps 16 can consume small, low current. The read only sense amps 16 are not used during a logical access mode.

The logical interface 14 can be a logical access mode. The logical interface 14 can be a narrow interface (e.g., low throughput/bandwidth). For example, the logical interface 14 can be 8 bits. The logical interface 14 can utilize bigger, high power read/write sense amps, as illustrated. For example, the logical interface 14 can comprise a first sense amp 18, a second sense amp 20, through an eighth sense amp 22 (referred to collectively as read/write sense amps 18-22). The physical interface 12 can have a high throughput/bandwidth. The read/write sense amps 18-22 (e.g., the first sense amp 18, the second sense amp 20, through the eighth sense amp 22) can utilize a relatively big, high current. Further, the read/write sense amps 18-22 are not utilized during a physical access mode. Outputs and inputs of the read/write sense amps 18-22 are illustrated as connected to Logical IOs (e.g., LIO_0 through LIO_7).

The computing memory architecture 10 can have two modes of operations: logical and physical (or wide and narrow). The lower address bits are not used in physical or wide mode. For example, during physical or wide mode, a YMux 13 is not used, only a XMux 15 is used to select the wordline (WL) (e.g., a wordline of wordlines $WL_0$ through $WL_{1023}$). Further, during physical or wide mode, all bitlines are used (e.g., are decoded). In the logical or narrow mode, both YMux 13 and XMux 15 are used. For example, XMux 15 can be utilized to select the wordline, YMux 13 can be utilized to select the bitline.

For example, the computing memory architecture 10 array can be asymmetric and can comprise two interfaces. One interface (e.g., logical interface 14) can comprise a small number of Input/Outputs (IOs) and big sense amps for write and optionally read. These reads and writes are logical since the bitlines are shoveled around (e.g., subsets of 8 bitlines selected in sequence until a logical operation is complete) in the YMux 13, as would be understood by one of ordinary skill in the art. A second interface (e.g., physical interface 12) can comprise a large number of IOs and small sense amps optimized for current consumption, speed, and size. The second interface does not use the YMux 13, only XMux 15 since all the bitlines are read at once and hence low current SA is a must to read large number of bitlines (e.g., 512, 2048, or even more). Since these memories are targeted for read intensive applications, slower and lower bandwidth writes are acceptable. Furthermore, since all the bitlines are read, it is a physical read. Logical read can be optional to check the data written or stored to memory array 11 but it is not a must since the data can be read physically and some physical to logical mapping can be performed. Therefore, the memory comprises two interfaces, logical slow BW using YMux 13 and high bandwidth physical (no YMux); asymmetric throughput.

In further detail, in logical or narrow mode, all address lines can be used by both XMux 15 (selects a wordline) and YMux 13 (selects a subset of bitlines) to decode a byte (or word or doubleword). In physical or wide mode, only XMux 15 is used to select a wordline and YMux 13 is not used since all bitlines are being sensed. Thus, there can be a mode register, for example, to select the access type (narrow or wide).

There can be various sensing procedures in memory architectures. The sensing procedures can be designed based on the specification(s) and the architecture of the intended product. By way of example and not limitation, if many bitlines are to be sensed (e.g., more than 1000 simultaneously) and keep the product active and current manageable (e.g., low current, such as ~<50 mA), a pure charging and discharge sensing procedure can be adopted. According to this procedure, intended bit lines can be precharged. Further, the selected memory cells (a row of cells) can be activated. If a cell is programmed to be conductive the bit line is discharged. If a cell is not programmed and highly resistive the precharged value will remain. A simple latch type sensing can be used to detect the state of the bit lines. The latch can be designed with limited current operation such that the average current consumption does not exceed the 50 mA. This can be a common sensing procedure adopted in many NAND products.

However, if speed (or low latency) is required or is the priority, then providing active sensing is needed. According to an active sensing protocol, a reference current/voltage can be set (e.g., a current can be kept high). The reference current can be set at the center point between the high and low resistance states of the cells. All sense amps (op amps) are active and ready to monitor the state of the memory cells. A cascoded transistor can be used to clamp the bit line to reduce the Bitline swing (e.g., used for fast sensing). A short precharge phase could be used. When the selected cells are activated, current is injected into the selected cells. Cells with low resistance will react to the injected current and the associated sense amps will change their state. Cells with high resistance will stay unchanged and the associated sense amps will stay at their present state. It is noted that the active current injected per bit line and the active current in each sensing circuit (OPAMP) will increase the current consumption of this approach. Further, the selected bit lines in this approach will be limited by the current consumption of each active sense amp. In addition, with this sensing scheme faster sensing is achieved with more current consuming sense amps. In an example, many bit lines may be used for image data, and few bit lines may be used for kernel (convolution) data. Because the kernel is used often, higher power sense amps may be used.

It is noted that a large portion of a read/write SA circuit can be associated with the write operation, which is actually two separate program and erase operations. This will make the SA bigger. Also, different techniques of designing SA can be used for read only SA.

In further detail, read/write sensing can include many additional components that makes it larger than a read sensing. The following is a non-limiting example of additional components that are needed for a Read/Write sensing: write sensing circuits, verify circuits, analog referencing circuits, and/or array referencing circuits and memory cells. Write sensing circuits may need larger transistors to provide the necessary current drive to set and reset (or program/erase). Verify circuits are utilized to sense the written cell and check and see if it was written or not. This is usually a different circuit then the normal read sensing since it requires to shift the sensing margin to much higher or much lower levels than a normal read sensing to check for a good "0" and a good "1" data. Analog referencing circuits are utilized to generate the "0", and "1" verify margin levels. Further array referencing circuits and memory cells are added to make sure the references track process changes across the die or wafer.

Figure 2:
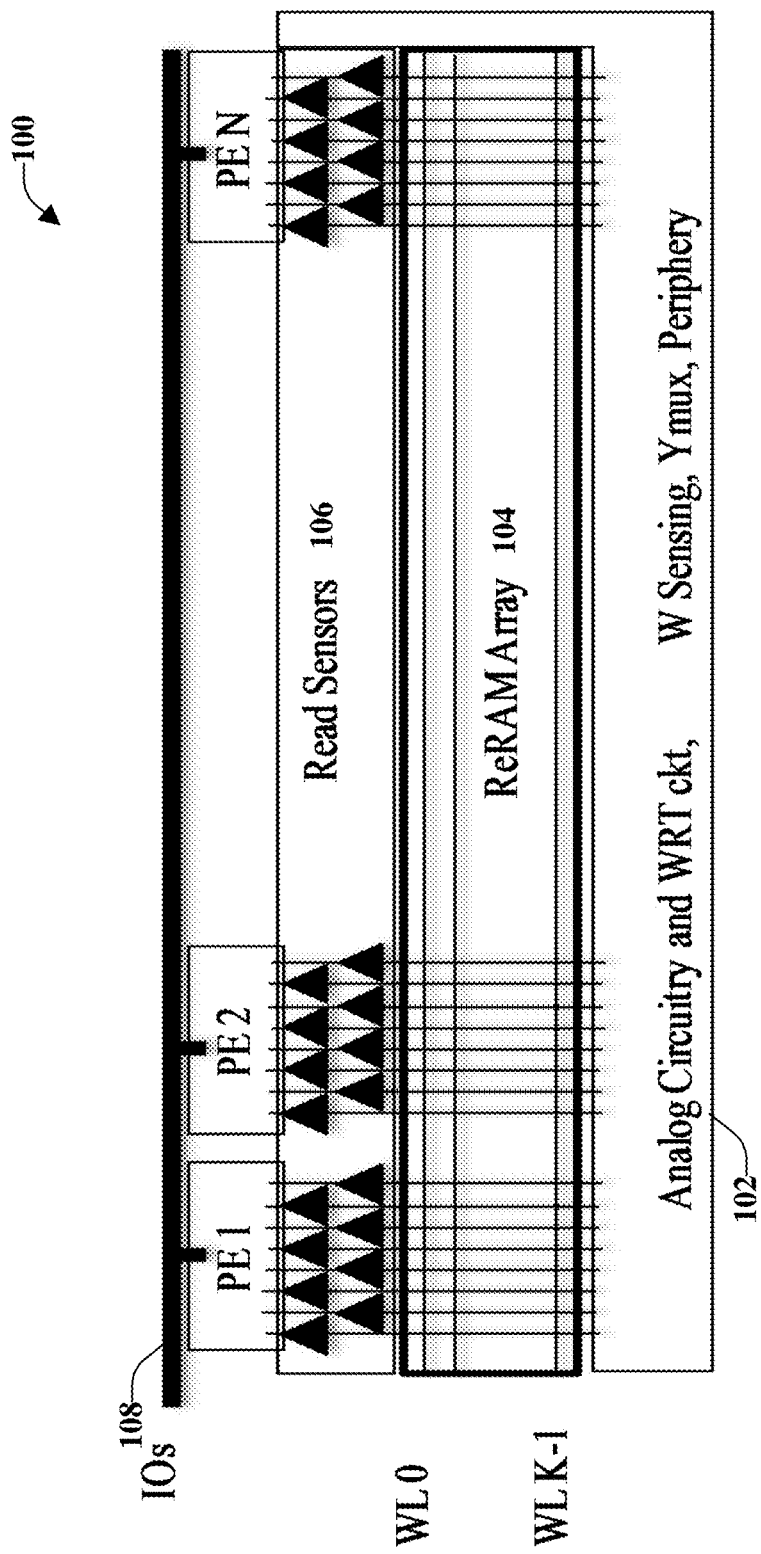
FIG. 2 illustrates an example memory array architecture according to an embodiment of the subject disclosure.

FIG. 2 illustrates a schematic diagram of an example computing memory architecture 100 according to an embodiment of the subject disclosure. The computing memory architecture 100 can comprise a very wide memory array and a highly parallel computing engine. Conventional memory arrays can have multiple bitlines and wordlines. For example, conventional memory arrays can have a 32-bit output (or a 64-bit output). Even though these conventional memory arrays can have multiple bitlines and wordlines, access to only a 32 bit (or 64 bit) array is provided. In contrast, the various aspects provided herein provide the capability of the memory array to read a larger number of bits than conventional limitations (e.g., 1,024 bits, 2,048 bits, or more bits) at about the same time. Thus, the various aspects can increase memory capacity and can increase processing power capability as will be discussed herein.

The computing memory architecture 100 can include analog circuitry 102. Also included in the computing memory architecture 100 is a resistive random access memory or ReRAM array 104 comprising multiple sets of bitlines and multiple wordlines. Also including in the computing memory architecture 100 can be read sensors 106 or read sense amps connected to the multiple sets of bitlines and configured to acquire stored data from memory cells of the ReRAM array 104. According to some implementations, the computing memory architecture 100 can be read intensive. For example, there can be one read sense amp per bitline for a given number of bitlines (e.g., 1,024, 2,048, or other suitable number), which can provide a high throughput for read operations. In addition, there can be write sense amps per sets of bits (e.g., 8, 16, or 32 bits). As such, the analog circuitry 102, which can include sense amps associated with write operation(s), can remain small in size and current consumption associated with write operations can remain low. Further, the computing memory architecture 100 can comprise multiple wordlines, illustrated as a first wordline (WL 0) through wordline K-1 (WL K-1), where K is an integer. The computing memory architecture 100 can include 1,024 bits lines, 2,048 bits lines, and so on, in addition to the K number of wordlines.

Programmable processing elements (PEs) can be located on top of the array (e.g., the ReRAM array 104) and can be connected to respective groups or set of the multiple bitlines of the ReRAM array 104. Further, the one or more programmable processing elements can be connected to a data interface. For example, the one or more processing elements can be located adjacent input/output lines (e.g., I/Os 108). Illustrated are a first processing element (PE 1), a second processing element (PE 2), through an N processing element (PE N), where N is an integer. As illustrated, the one or more programmable processing elements can be located between the data interface and the ReRAM array 104 and can be physically connected with the multiple sets of bitlines of the ReRAM array 104.

The one or more programmable processing elements can independently compute or determine respective functions (e.g., sensing, matching, logical algorithms, mathematical algorithms, and so on) and output a result of the independent processing functions. The one or more programmable processing elements can be configured to receive stored data from the ReRAM array 104 via the respective sets of bitlines and/or to receive data from an external device via the data interface. Further, the one or more programmable processing elements can execute a logical or mathematical algorithm on the external data and/or on the stored data and generate processed data.

According to some implementations, the wordlines can be activated sequentially and/or randomly. However, all the processing elements connected to groups of bitlines activated by a wordline will receive data from memory cells activated by that wordline. As different wordlines are activated (e.g., one wordline at a time), data from different rows of memory cells can be provided to the processing elements.

In accordance with a non-limiting example, the computing memory architecture 100 can comprise 2,048 bitlines and one or more processing elements can utilize 16 bits of inputs. Thus, there can be 128 processing elements located on top of the ReRAM array 104, in an implementation where the processing elements are associated with the same quantity of bitlines. Accordingly, the computing memory architecture 100 can be utilized for highly parallel computing.

According to some implementations, a different quantity of bitlines can be connected to respective processing elements of the one or more processing elements. For example, a first processing element can be associated with 8 bitlines and a second processing element can be associated with 16 bitlines. The first processing element and the second processing element are accessing data on the same wordline, however, the second processing element is using more bitlines than the first processing element in this example. Further, the data provided to the one or more processing elements is generally from a same wordline.

In the example of FIG. 2, the first set of bitlines are dedicated for PE 1, the second set of bitlines are dedicated for PE 2 and so on. Thus, when wordline 0 (e.g., WL 0) is activated, for example, PE 1 receives its respective information from a first group of memory cells on WL 0 and the first set of bitlines, by way of the first set of bitlines. Further, when wordline 0 is activated, PE 2 receives its respective information from a second group of memory cells on WL 0 and the second set of bitlines, by way of the second set of bitlines, and so on. When wordline 1 (WL 1) is activated, PE 1 receives its respective information from a third group of memory cells on WL 1 and the first set of bitlines, again over the first set of bitlines, and PE 2 receives its respective information from a fourth group of memory cells on WL 1 and the second set of bitlines, over the second set of bitlines, and so on. Thus, the engine can feed data on a given wordline to different processing elements connected to memory cells on that wordline, and repeat this process for differing wordlines of the ReRAM array 104.

According to some implementations, if one or more bit lines of the memory array are defective, the memory array can continue to be utilized by disabling the one or more processing elements associate with the defective bit lines. The one or more processing elements can be disabled and/or or its computed value can be ignored or discarded. Accordingly, a production yield can be increased, which can lower a cost associated with the computing memory architecture 100.

The example computing memory architecture 100 can be configured to perform various logical or mathematical functions by way of programmable processing elements PE 1 through PE N. Some non-limiting examples of such functions can include a sensing function, a pattern recognition, a feature extraction, a NAND operation, a NOR operation, a XOR operation, or any other suitable logical or processing operation, as well as various mathematical functions, and so on. By way of example and not limitation, for feature extraction, a set of features can be retained in a library or data store (e.g., programmed into the memory array). For this example, there can be thousands of feature data, wherein respective sets of the thousands of feature data can be provided to the one or more processing elements (e.g., a processing element of the one or more processing elements receive its respective input from the ReRAM array 104). Thus, the first processing element (e.g., PE 1) can receive its respective feature data, the second processing element (e.g., PE 2) can receive its respective feature data, and so on.

In a specific end-use example, the pattern recognition and feature extraction can be utilized to implement facial recognition. Instructions for analyzing sets of data to identify or infer facial feature information can be directed to the processing elements to perform a particular task. In an example, pre-captured facial features/pictures can be programmed into the ReRAM array 104. A surveillance camera (or other image capture device) can capture pictures of what is to be analyzed, and captured picture data can then be fed into one or more processing elements where the captured picture is processed by one or more processing elements against their respective stored pictures. The respective stored data associated with pre-captured pictures is fed to their corresponding one or more processing elements, which implement the facial recognition algorithm against the captured picture.

Because the processing elements are integrated within computing memory architecture 100, facial recognition can be implemented in conjunction with stored images in the array. In an embodiment, a plurality of the processing elements can be leveraged to implement the facial recognition algorithm, in parallel on different sets of data. Alternatively, different processing elements can be leveraged to implement different subsets of the facial recognition algorithm on subsets of the data. In one particular example, computing memory architecture 100 can be incorporated into an electronic device (e.g., a digital security camera) that takes pictures of individuals entering an area monitored by the electronic device. Authorized individual pictures, such as employees of a company, can be stored into ReRAM array 104, and the processing elements can compare the picture data against stored picture data to determine, in the case of facial recognition for instance, whether an individual within the monitored area is an authorized individual represented by the stored picture data. According to an implementation, details associated with the match, such as employee name, work location, and so on, can also be stored in ReRAM array 104 to facilitate additional onboard processing by computing memory architecture 100.

It is noted that data is retained in the memory, not in the processing element(s). However, the processing element performs a logical or mathematical computation on input data and data on the ReRAM array 104 to generate processed data, which can be output from computing memory architecture 100 or stored in some registers or memory within the computing memory architecture 100 or a scratch pad area within the ReRAM array.

As mentioned above, the processing elements can operate in parallel on separate instructions, on separate data, as well as integratively on a common set of instructions or data. As an example of the former in the context of the facial recognition paradigm, two processing elements (e.g., PE 1 and PE 2) can be provided with a same set of picture data representing a captured picture of a person. Both processing elements can compare the respective captured picture data to stored picture data of authorized personnel in their respective bitlines of the ReRAM array 104, for instance PE 1 evaluates the picture data against the stored picture data and fails to determine a match. PE 1 can output a facial recognition failure. However, PE 2 evaluates the picture data and determines it is a match to stored picture data in bitlines corresponding to PE 2, and outputs a facial recognition success. Although this example was discussed with respect to two processing elements, a memory architecture as provided herein can include multiple processing elements (e.g., 1,000 processing elements, 10,000 processing elements, and so on). Thus, hundreds (or even thousands) of pictures can be compared against the input data and the multiple processing elements can compare the incoming picture to respective stored pictures simultaneously. Further, although discussed with respect to images or pictures, the disclosed aspects are not limited to an implementation related to optical recognition. Instead, the processing can be performed for any suitable simple logic or mathematical algorithms, (e.g., AND operation, NOR operation, multiplication, etc.), to varying degrees of complex logic or mathematical algorithms (e.g., machine-learning algorithms for sentiment analysis e.g., including words, dialog, and so on, for simulated neural networks, derivative calculus, or other suitable machine-implemented algorithms. It is noted that the accuracy of the comparison (or other functionality) can be in direct proportion to the amount of data available to the one or more processing elements.

In another example, social media feeds can be processed in accordance with the various aspects provided herein. The sentiment and/or the words included in the social media feeds can be determined by the one or more processing elements. Sentiments or phrases can be programmed into the ReRAM array 104. Social media feeds can be fed to the processing elements and compared against the sentiment and phrases. According to an implementation, a counter can be associated with the computing memory architecture 100 and utilized to determine how many times a particular sentiment was shared through the social media feeds. Further, if there are 125 social media feeds, for example, all 125 feeds do not have to be input to the processing elements at the same time. Instead, the one or more feeds (or other data, such as images) can be provided at different times.

FIG. 2 illustrates an example processing element 200 according to an embodiment of the subject disclosure. The processing element 200 can be PE 1, PE 2, through PE N of FIG. 2. As illustrated the processing element 200 can have multiple inputs (e.g., two inputs, three inputs, etc.) namely, a first input 202 and a second input 204. The first input 202 can be configured to receive data from the ReRAM array. Thus, the first input 202 can include data stored at ReRAM array (e.g., the ReRAM Array 104 of FIG. 2) and pulled up on the respective bitlines connected to the processing elements. The second input 204 can be configured to receive data from an external device. Thus, the second input 204 can include incoming data, which can be received from through the data interface, or the one or more input/output lines (e.g., the I/Os 108 of FIG. 2). The incoming data received over the second input 204 can originate at a source external to the computing memory architecture 100, such as an integrated electronic device (e.g., the camera providing picture data) or a host computing device (e.g., providing social media feed data), or other suitable device.

The output 206 can be provided separately from the outputs of other processing elements of the memory array. However, according to some implementations, the output 206 can be cascaded with respective outputs from the other processing elements. For example, the various outputs can be cascaded together, processed and produce a single output. According to some implementations, processed data can be selectively provided by output 206 only in response to satisfaction of a condition(s) (e.g., in response to the processed data being within a certain threshold parameter or matching a category parameter associated with first input data 202). According to some implementations, the one or more outputs can be provided and an entity that can perform the match determination.

Figure 3:
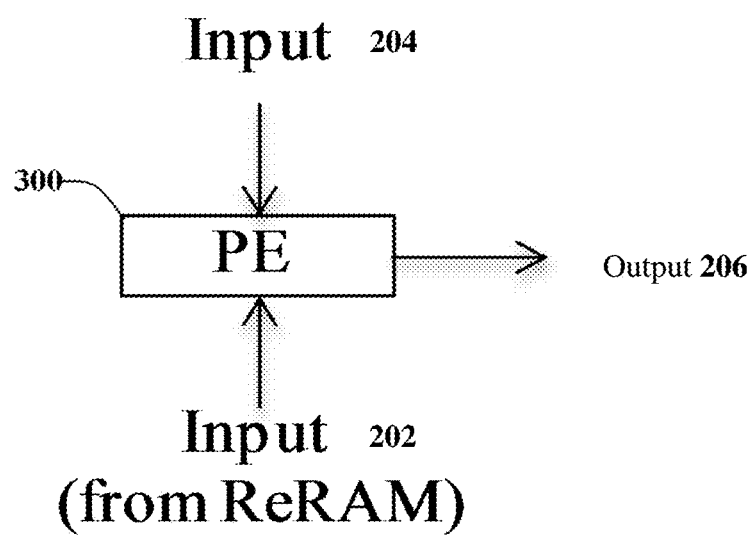
FIG. 3 illustrates an example processing element according to an embodiment of the subject disclosure.

FIG. 3 illustrates an example memory array architecture 300 that includes parity bits according to an embodiment of the subject disclosure. Repetitive description of like elements employed in other embodiments described herein is omitted for sake of brevity.

As illustrated, one or more correction code decoders can identify an error(s) in data stored in the ReRAM array 104 and correct the data error(s) prior to the (erroneous) data being sent to the one or more processing elements. For example, a first correction code decoder 302 can be associated with PE 1, a second correction code decoder 304 can be associated with PE 2, and an $N^{th}$ correction code decoder 306 can be associated with PE N. Subsets of data stored at the ReRAM array 104 can be associated with parity bits utilized for error correction algorithms. In an example, a 16 bit processing element can utilize a few bits for parity (e.g., 5 bits, 6 bits, and so on). The parity bits can be additional bits allocated to the respective processing element such that the example processing element retains its 16 bits in order to perform its associated function. As compared to the computing memory architecture 100 of FIG. 2, the memory array architecture 300 of FIG. 4 comprises two additional bits going to the one or more processing elements. However, other implementations can utilize fewer or more bitlines for parity than the number shown and described.

Figure 4:
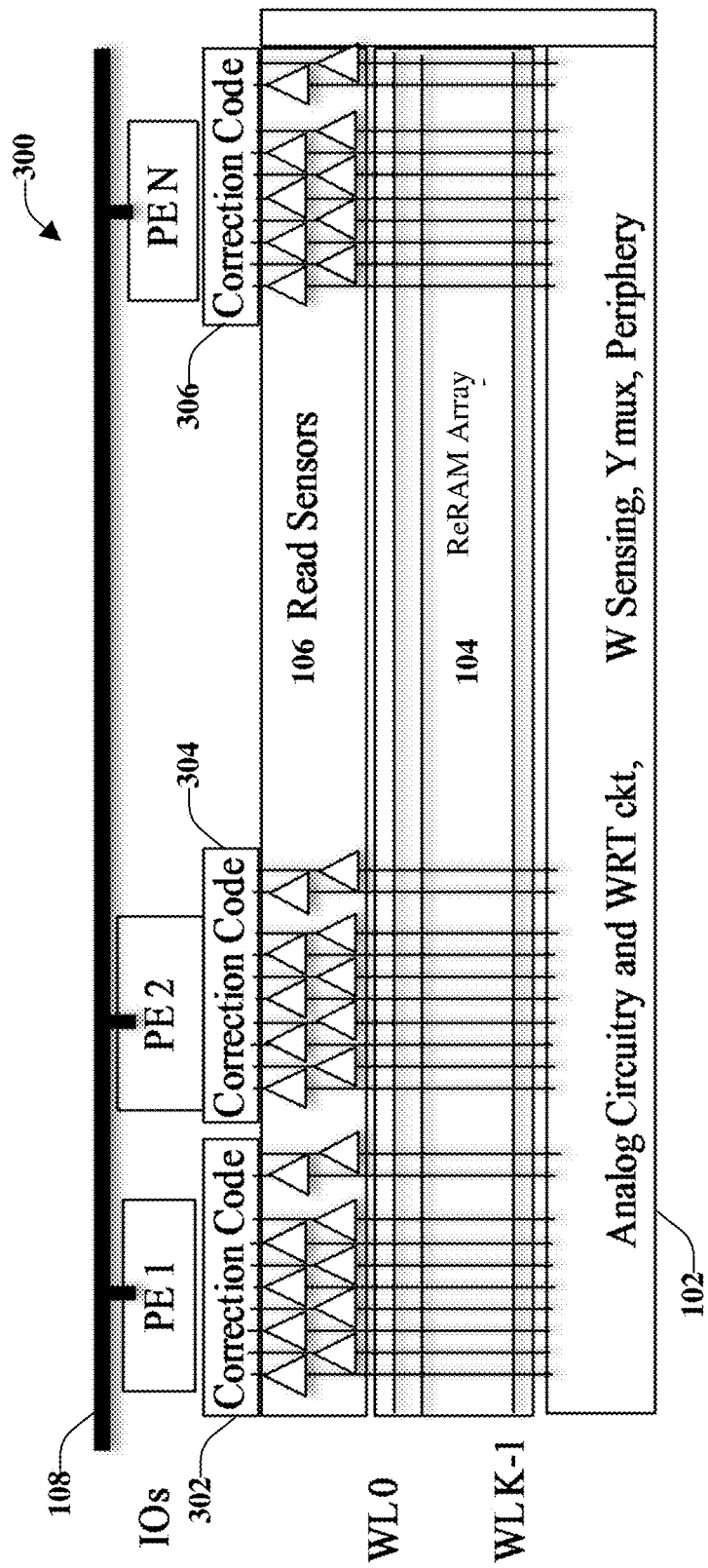
FIG. 4 illustrates an example memory array architecture that includes parity bits according to an embodiment of the subject disclosure.

FIG. 4 illustrates an example memory array architecture 400 that includes shared parity bits according to an embodiment of the subject disclosure. Repetitive description of like elements employed in other embodiments described herein is omitted for sake of brevity.

According to some implementations, to optimize overhead associated with the parity, there can be parity across more than one processing element. As illustrated, a correction code decoder 402 can be utilized for two processing elements (e.g., PE 1 and PE 2). However, in other implementations, more than two processing elements can share a correction code decoder. Thus, the correction decoder can correct data prior to the data being sent to the one or more processing elements. The correction code can span across multiple processing elements for efficient correction coverage.

Figure 5:
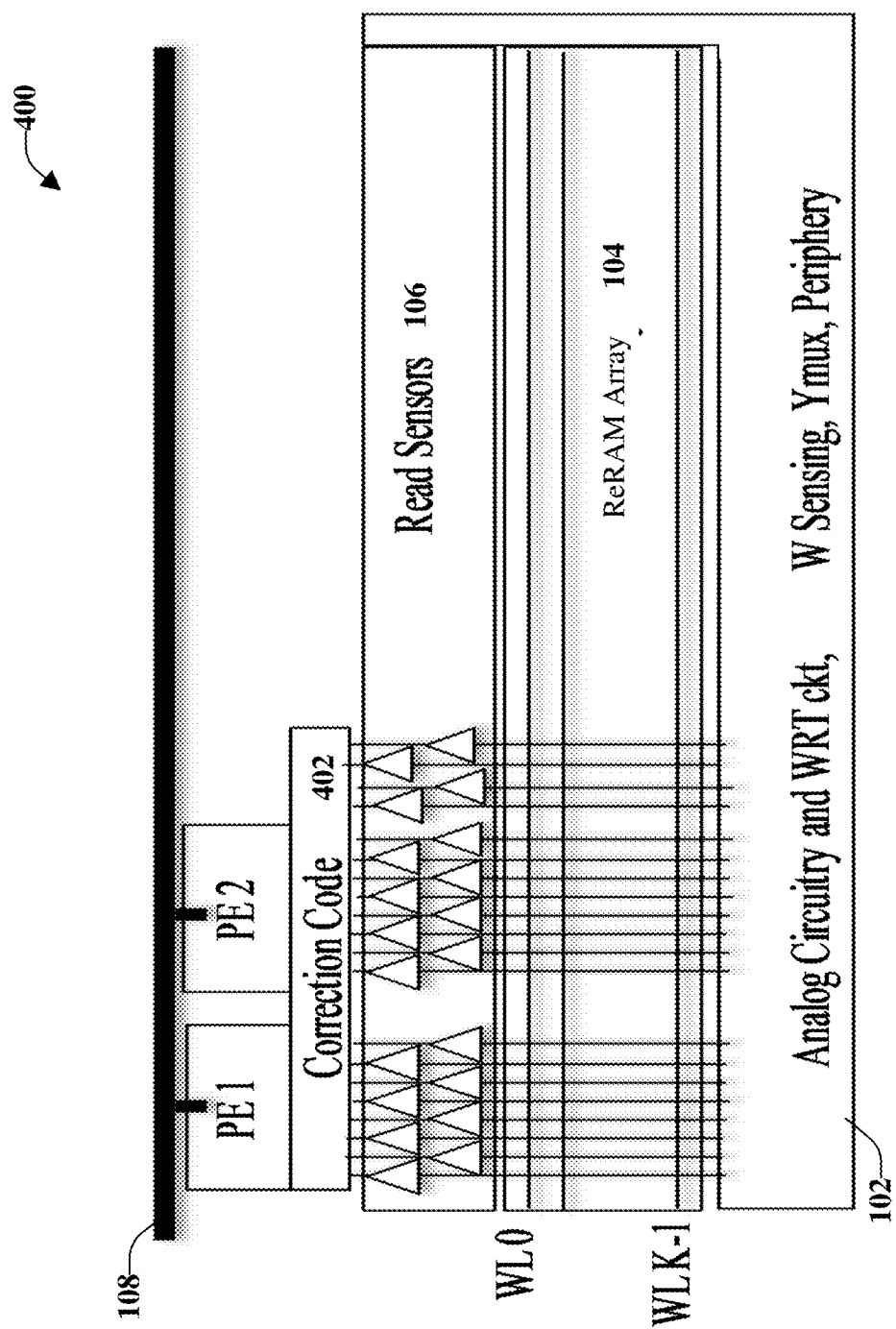
FIG. 5 illustrates an example memory array architecture that includes shared parity bits according to an embodiment of the subject disclosure.

FIG. 5 illustrates an example of multiple memory arrays 500 sharing write circuitry logic according to an embodiment of the subject disclosure. According to an aspect, the write circuitry can be shared among multiple arrays, as illustrated by the analog circuitry and write circuit 502. In this example, the analog circuitry and write circuit 502 is shared by the multiple memory arrays located above and below the analog circuitry and write circuit 502. In this manner, the footprint (or geometric area) of the memory architecture does not need to increase in proportion to the space of the multiple memory arrays. However, the bandwidth for reading and writing may be reduced (e.g., slightly longer processing time) with a shared analog circuitry and write circuit 502, however, the tradeoff is that the area efficiency is increased (e.g., the size of the memory architecture uses less space as compared to memory arrays that do not share write circuitry logic). The analog circuitry and write circuit 502 is mainly used to initialize the ReRAM arrays and infrequent updates to the array and, as such, will not affect the performance of the engine. Each of the memory arrays can still maintain their dedicated read sensors, which is utilized during normal computational operations.

According to some implementations, the wordlines can be accessed sequentially and the row decoder can be a counter 504 or a x multiplexer (e.g., x mux). For example, the counter 504 can start at zero, then count through one, two, three, and so on. This does not need a full row decode. For example, the counter can progress from one wordline to the next wordline as it counts. According to another implementation, the counter can be a shift register with a rolling bit. For example, the shift register can have zeros and/or ones and can be shifted as it progresses sequentially through the wordlines.

Figure 6:
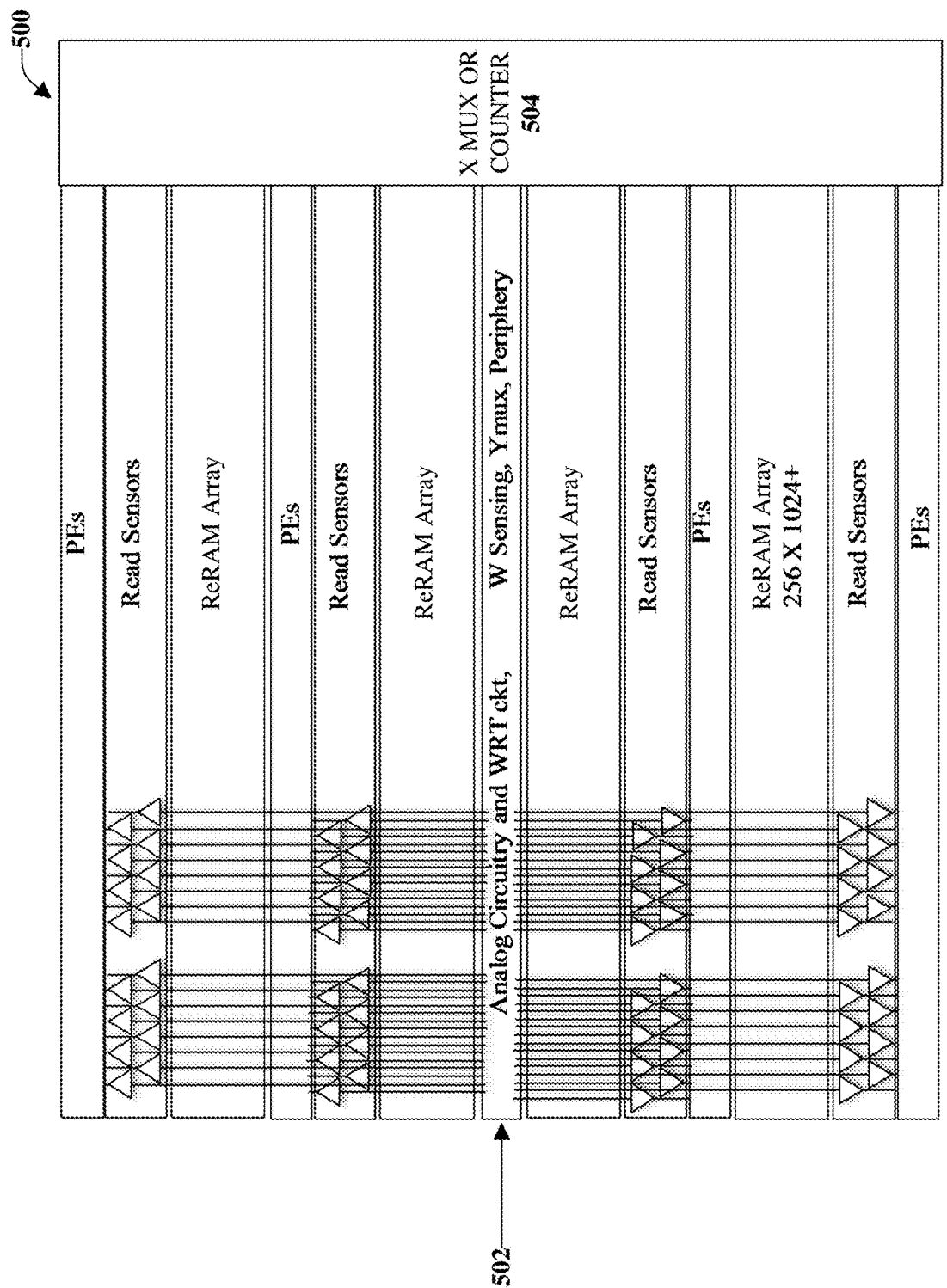
FIG. 6 illustrates an example of multiple memory arrays sharing write circuitry logic according to an embodiment of the subject disclosure.

FIG. 6 illustrates an example resistive random access memory array 600 according to an embodiment of the subject disclosure. Repetitive description of like elements employed in other embodiments described herein is omitted for sake of brevity.

Figure 7:
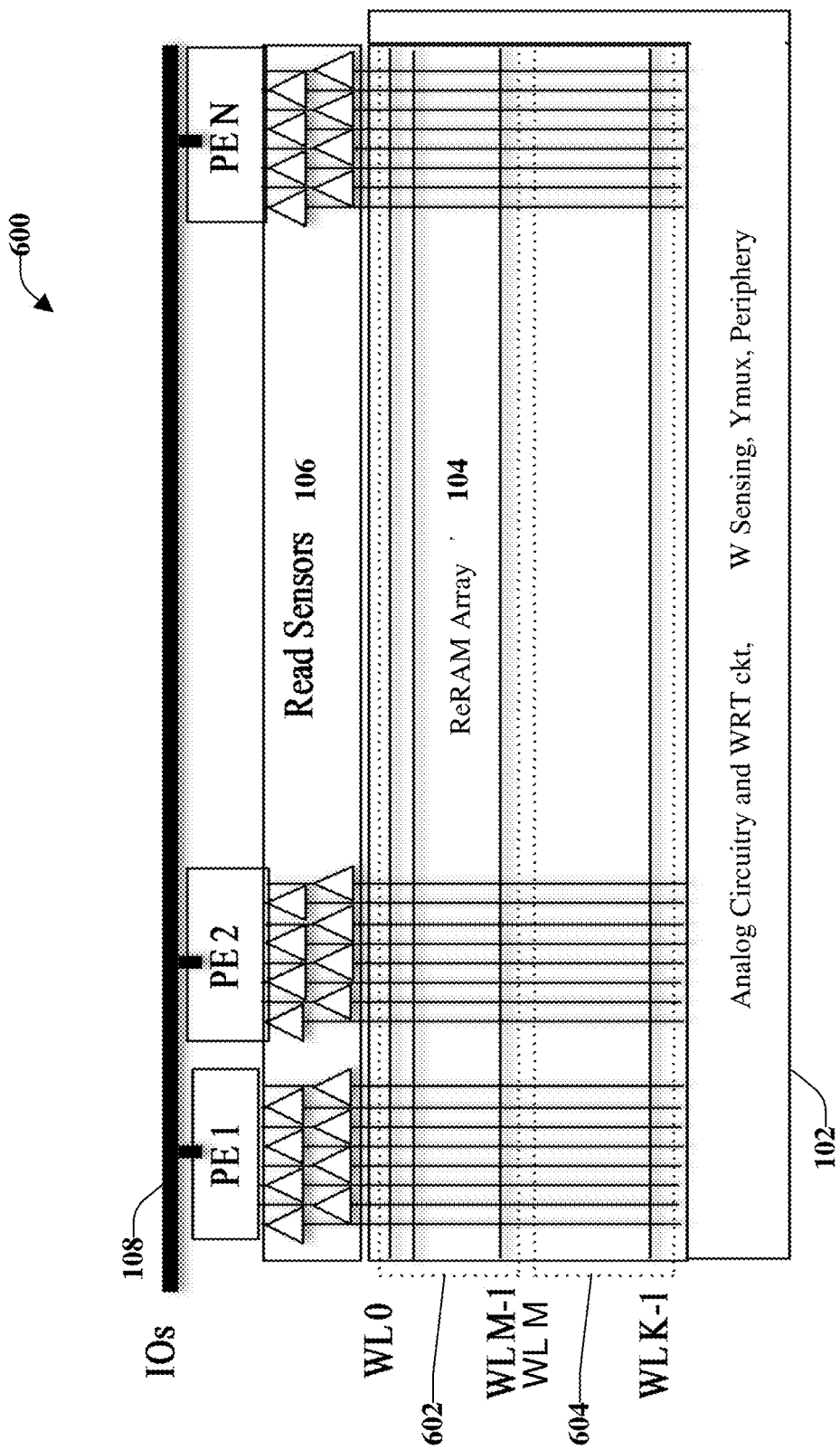
FIG. 7 illustrates an example resistive random access memory array according to an embodiment of the subject disclosure.

The resistive random access memory array 600 can comprise one or more wordline start pointers and one or more wordline stop pointers that can be configured to indicate a beginning and an ending of one or more groups of data, respectively. In some implementations, the resistive random access memory array 600 can have multiple sets of data and/or features for the one or more processing elements. For example, a first set of data is illustrated by dashed box 602 and a second set of data is illustrated by dashed box 604. In FIG. 7, for the first set of data, a first wordline start pointer can be provided at wordline 0 (WL 0) and a first wordline stop pointer can be provided at wordline M-1 (WL M-1). For the second set of data, a second wordline start pointer can be provided at wordline M (WL M) and a second wordline stop pointer can be provided at wordline K-1 (WL K-1).

To select one of the sets of data to send to a processing element(s), the wordline start pointer can be set to a wordline at which the set of data begins, and the wordline stop pointer can be set to a second wordline at which the set of data ends. A controller can sequentially activate wordlines starting at the wordline start pointer and ending at the wordline stop pointer to selectively send the one set of data, from the multiple sets of data, to the processing element(s).

According to an implementation, the wordlines can be selected sequentially. Further, a counter or shift register can be used as the wordline address decoder. The one or more processing elements can process the same input data and, therefore, can share the I/Os 108.

A category can be associated with at least a portion of the incoming data. In an example, a first set of data in ReRAM is associated with a first category and a second set of data in ReRAM is associated with a second category. For example purposes, the first category is related to "animals" and the second category is related to "trees." According to this example, when the incoming data is received, an indication is provided that identifies the category associated with the data (e.g., the data is assigned to one of the two categorizes (e.g., a tree or an animal)). Based on the indicator, either the first set of data or the second set of data in ReRAM is fetched by the processing elements. For data associated with the category trees, the processing elements can fetch the second set of data in ReRAM associated with trees to perform a match.

Such categorization can also be applied for the array of FIG. 6 and, if the type of incoming data is known, only the processing elements (or processing engines) that have that type of data category need to be activated. The other processing elements do not need to be activated, since is already known that those other processing elements will not match. Accordingly, power can be conserved since excessive processing elements do not have to be activated.

Thus, if two categories are mutually exclusive (such as the example of animals and trees) only a subset of the one or more processing elements are activated when the categorization is known. However, if two or more categories are not mutually exclusive (e.g., there is some overlap), all processing elements are activated.

Further, the different portions of data related to the different categories can be placed in different portions of the memory. In an example, wordline 0 through wordline M-1 (e.g., WL 0 through WL M-1 in FIG. 7) can have the features for the first category and wordline M to wordline K-1 (e.g., WL M to WL K-1) can have the features for the second category. If it is known a priori the category for the incoming data (which can be stored in ReRAM array 104), the wordlines associated with that category can be utilized and those wordlines can push the data to the processing elements. Accordingly, there can be twice as many features in the array without significantly increasing the size of the array.

However, continuing the above example, if the category is not known a priori, or both sets of categories should be utilized (e.g., not mutually exclusive), the first set can be processed first and the second set can be processed second. Accordingly, twice as many feature sets can be included in the logic without significant changes to the size of the array, however, the processing speed can take about twice as long. Thus, with the same engine the data can be compared against twice as many feature sets.

According to an implementation, a size of the ReRAM Array 104 of the memory array 600 can be significantly smaller than the analog circuitry 102 and read sensors 106 and as such, increasing the wordlines by a factor of 2 or 4 will not increase size of the memory array 600 substantially. Increasing the number of wordlines can increase the number of features that can be stored in the ReRAM array 104.

The diagrams included herein are described with respect to interaction between several memory cells, memory cell components, or memory architectures. It should be appreciated that such diagrams can include those memory cells, components and architectures specified therein, some of the specified memory cells/components/architectures, or suitable alternative or additional memory cells/components/architectures. Sub-components can also be implemented as electrically connected to other sub-components rather than included within a parent architecture. Moreover, some of the disclosed embodiments can be implemented as part(s) of other disclosed embodiments where suitable. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of multiple cell memory architectures can be erased in groups (e.g., multiple rows erased concurrently) or individually. Moreover, it should be appreciated that multiple memory cells on a particular row can be read or programmed in groups (e.g., multiple memory cells read/programmed concurrently) or individually. Components of the disclosed architectures can also interact with one or more other components not specifically described herein but known by those of skill in the art or made evident by way of the context provided herein.

FIG. 7 illustrates another example computing memory architecture 700 according to an embodiment of the subject disclosure. Repetitive description of like elements employed in other embodiments described herein is omitted for sake of brevity.

As illustrated, the ReRAM array 104 can include configuration information for the processing elements. As illustrated, first configuration information (Config 1) corresponds to the first processing element (PE 1); second configuration information (Config 2) corresponds to the second processing element (PE 2); and Nth configuration information (Config N) corresponds to the Nth processing element (PE N). It is noted that the processing elements do not need to be the same.

Configuration information can be written to the ReRAM array 104. Upon or after power up, the configuration information can be loaded into the corresponding processing elements in parallel. Thus, Config 1 can be loaded into PE 1; Config 2 can be loaded into PE 2; and Config N can be loaded into PE N in parallel during initialization. Each processing element can have its unique configuration information stored in ReRAM and loaded during power up or initialization. According to some implementations, the parallel loading of information can reduce the power up time or waking up from standby, which can improve system latency and increase processing efficiency.

Figure 8:
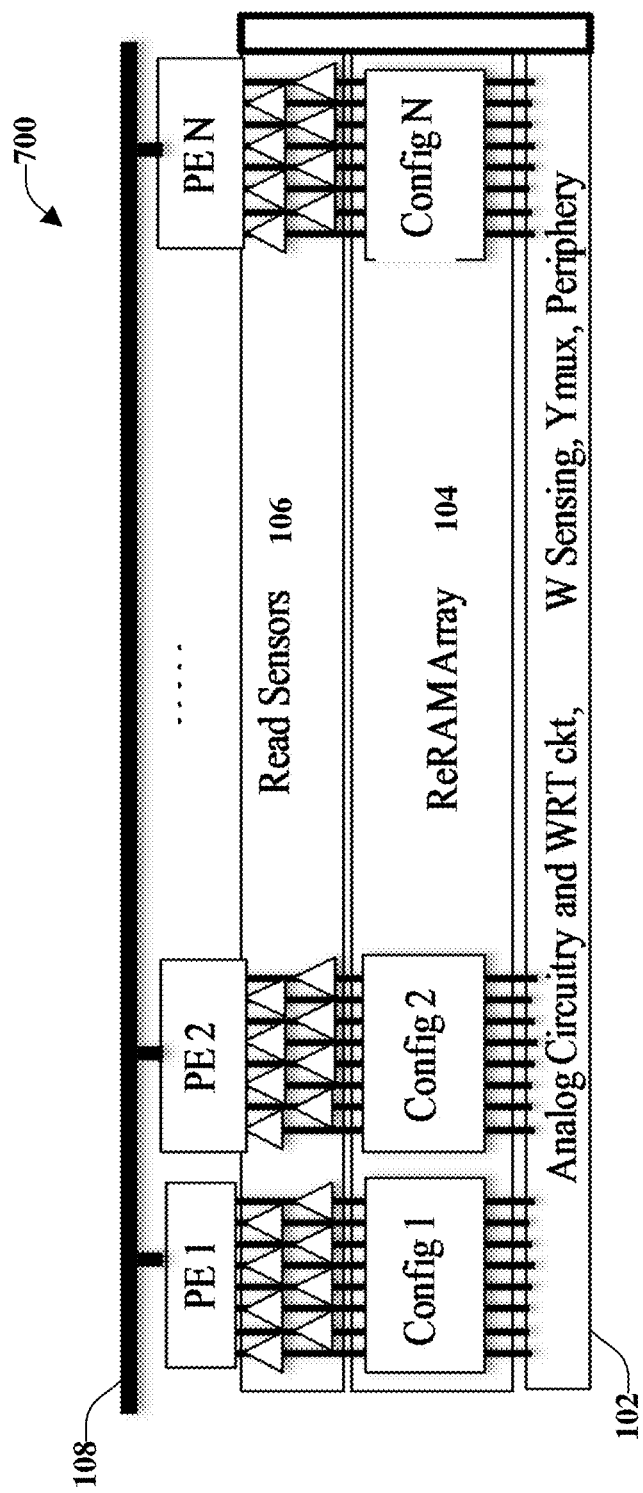
FIG. 8 illustrates another example computing memory architecture according to an embodiment of the subject disclosure.

FIG. 8 illustrates a further example memory array architecture 800 according to one or more embodiments of the subject disclosure. Repetitive description of like elements employed in other embodiments described herein is omitted for sake of brevity. This example is similar to the computing memory architecture 100 of FIG. 2. However, for the computing memory architecture 800 of FIG. 9, instead of processing elements, convolution accelerators can be utilized.

As illustrated, one or more kernels (or feature information) can be included in the ReRAM array 104. For example, illustrated are a first kernel (Kernel 1), a second kernel (Kernel 2), through an Nth Kernel (Kernel N), where N is an integer. One or more programmable convolution accelerators (CAs) can be located on top of the array (e.g., the ReRAM array 104). For example, illustrated are a first convolution accelerator (CA 1), a second convolution accelerator (CA 2), through an N convolution accelerator (CA N), where N is an integer.

The one or more programmable convolution accelerators can be connected to respective groups or sets of the multiple bitlines of the ReRAM array 104. Further, the one or more programmable convolution accelerators can be connected to a data interface 108. As illustrated, the one or more programmable convolution accelerators can be located between the data interface and the ReRAM array 104 and can be physically connected with the multiple sets of bitlines of the ReRAM array 104 and image input 802.

The one or more programmable convolution accelerators can perform convolution in parallel between the stored image in image input 802 and their respective kernels and store the result in filtered image memory. The one or more programmable convolution accelerators can be configured to receive stored data (Kernels) from the ReRAM array 104 via the respective sets of bitlines and to receive data from an image input memory 802 via the data interface 108. Further, the one or more programmable convolution accelerators can execute a logical or mathematical algorithm on the input data (e.g., image input 802) using their corresponding kernels and store the generated processed data in their respective output memory (e.g., filtered images memory). At the end of a convolution operation, each of the output memories can contain processed data corresponding to the common input data and their corresponding kernel.

Figure 9:
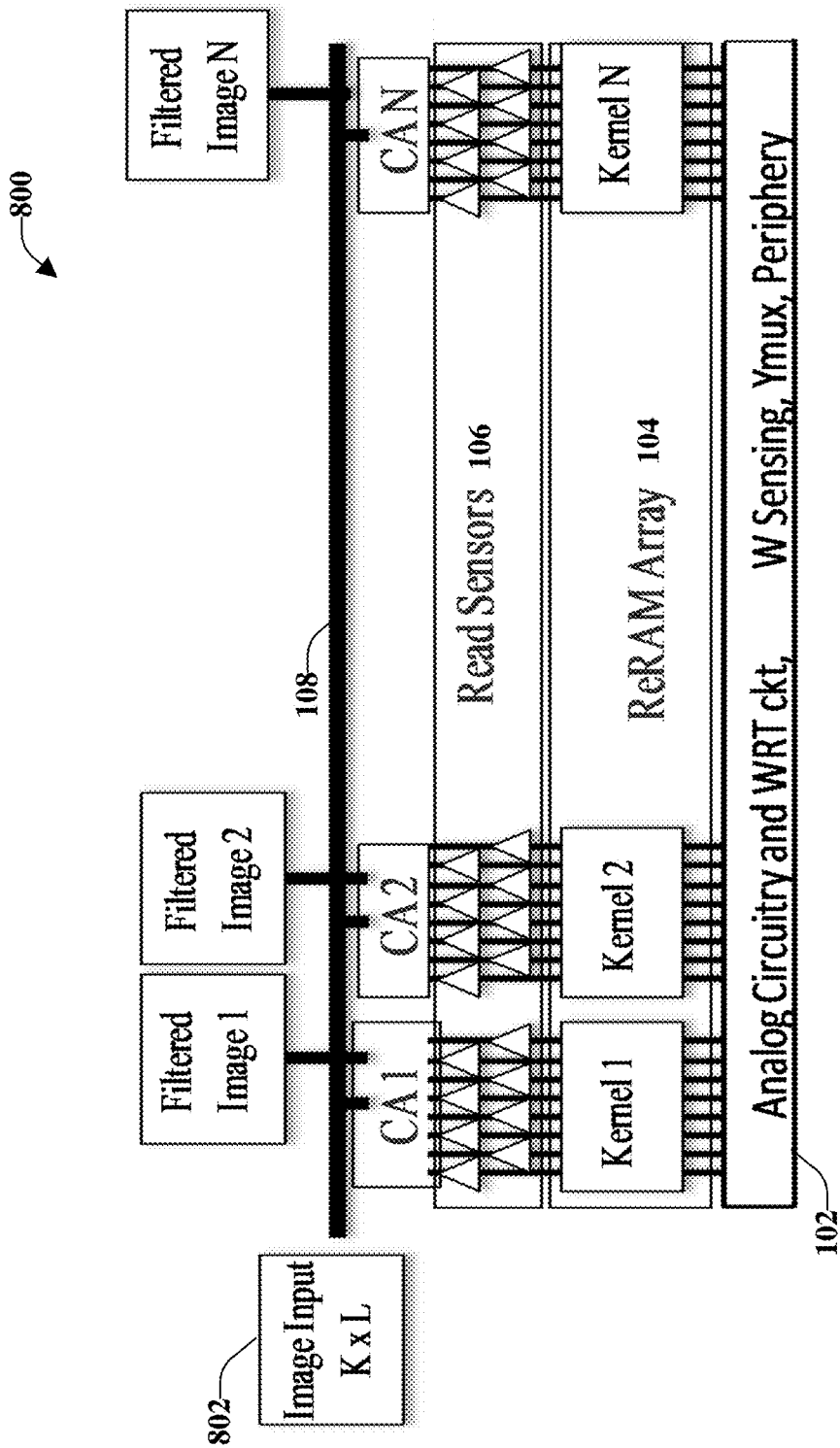
FIG. 9 illustrates a further example memory array architecture according to one or more embodiments of the subject disclosure.

FIG. 9 illustrates an example convolution accelerator 900 according to an embodiment of the subject disclosure. The convolution accelerator 900 can be, for example, CA 1, CA 2, through CA N of FIG. 9. The convolution accelerator 900 can have multiple inputs such as, for example, a first input 902 and a second input 904. The first input 902 can be configured to receive data from the ReRAM array and can include data stored at the ReRAM array (e.g., the ReRAM array 104 of FIG. 9). The second input 904 can be configured to receive data. For example, the second input 904 can be a memory or incoming data received through the data interface and/or the one or more input/output lines (e.g., the I/Os 108 of FIG. 9).

In an example, pixels from an image in an image input buffer can be input to the convolution accelerators. Further, the convolution accelerators can be loaded with their corresponding kernels. The convolution accelerators can perform convolution on the input pixels and the corresponding kernel, the results can be stored in a memory location of the corresponding image filter buffers. Upon or after the result is stored, the next set of pixels from the image input buffer can be input (or presented) to the convolution accelerators. The next set of pixels can be convolved with the kernel and stored in another location in the corresponding filtered image buffer until the entire input image is processed and filtered image buffers can have N set of independently filtered images of the same input image. Filtered images can further be filtered with other sets of kernels in the same HPM (Hierarchical Parallelism and Hierarchical Memories) or another HPM. The parallelism of convolution can be utilized to accelerate Neural Network computing, according to an implementation.

Figure 10:
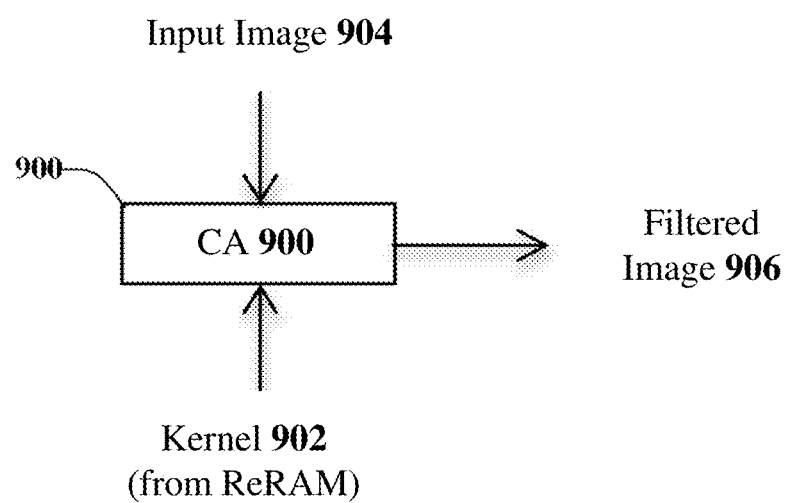
FIG. 10 illustrates an example convolution accelerator according to an embodiment of the subject disclosure.

FIG. 10 illustrates yet another example computing memory architecture 1000 according to an embodiment of the subject disclosure. Repetitive description of like elements employed in other embodiments described herein is omitted for sake of brevity. As illustrated, the ReRAM Array 104 can comprise the configuration information that can be used during the power up sequence. Further, the ReRAM array 104 can comprise the kernels or feature information that can be used by the processing elements to perform convolution or pattern matching upon or after configuration.

As illustrated, a first kernel (Kernel 1) can correspond to Config 1 and PE 1; a second kernel (Kernel 2) can correspond to Config 2 and PE 2; and an Nth Kernel (Kernel N) can correspond to Config N and PE N. During the power on or initialization, Config 1 can be loaded into PE 1; Config 2 can be loaded into PE 2; and Config N can be loaded into PE N in parallel. This parallel loading of information can reduce the power up time, which can increase processing efficiency. After initialization, the processing elements can use Kernel data or feature data stored in ReRAM.

Figure 11:
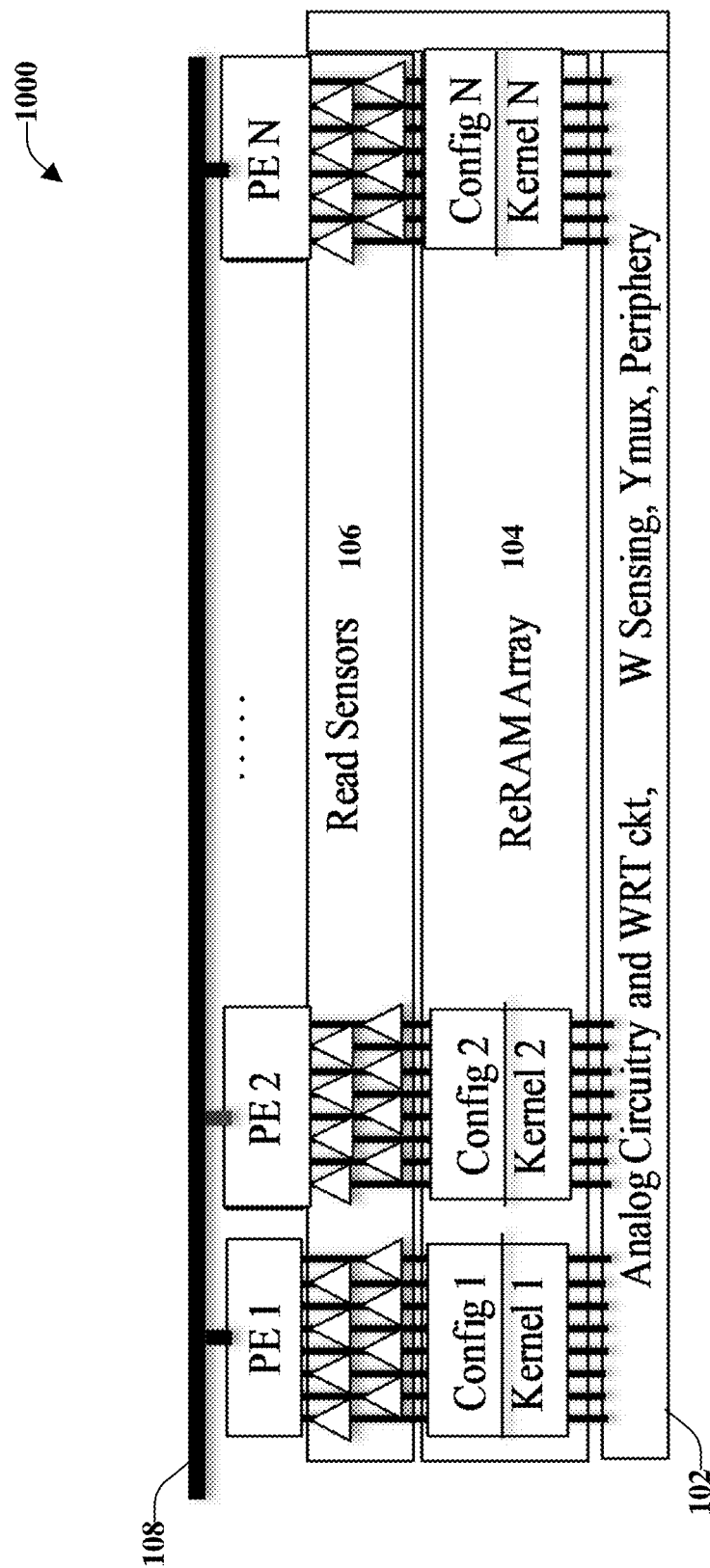
FIG. 11 illustrates yet another example computing memory architecture according to an embodiment of the subject disclosure.

FIG. 11 illustrates a further example computing memory architecture 1100 according to an embodiment of the subject disclosure. Repetitive description of like elements employed in other embodiments described herein is omitted for sake of brevity. The computing memory architecture 1100 comprises computing elements configured for versatility such that the computing memory architecture 1100 can be utilized for different applications.

As illustrated, the ReRAM Array 104 can comprise the configuration information and the kernels. Further, the ReRAM Array 104 can comprise various feature data, illustrated as first features (Features 1), second features (Features 2), through N features (Features N). Further, convolution accelerators and processing elements can be located on top of the array (e.g., ReRAM Array 104).

In an example, the device can be configured for use of the processing elements and/or the convolution accelerators. Further, the device can be configured to dynamically switch between the processing elements and/or the convolution accelerators. When performing the dynamic switching, configuration data can be utilized to configure the device. Thereafter, the kernel data can be utilized for the convolution accelerators and the feature data can be utilized for the processing elements. Accordingly, the one or more computing engines (or one or more elements) can have respective sets of data in the ReRAM Array 104 and can be loaded to the engine appropriately for the configuration (e.g., use of the processing elements or use of the convolution accelerators).

Figure 12:
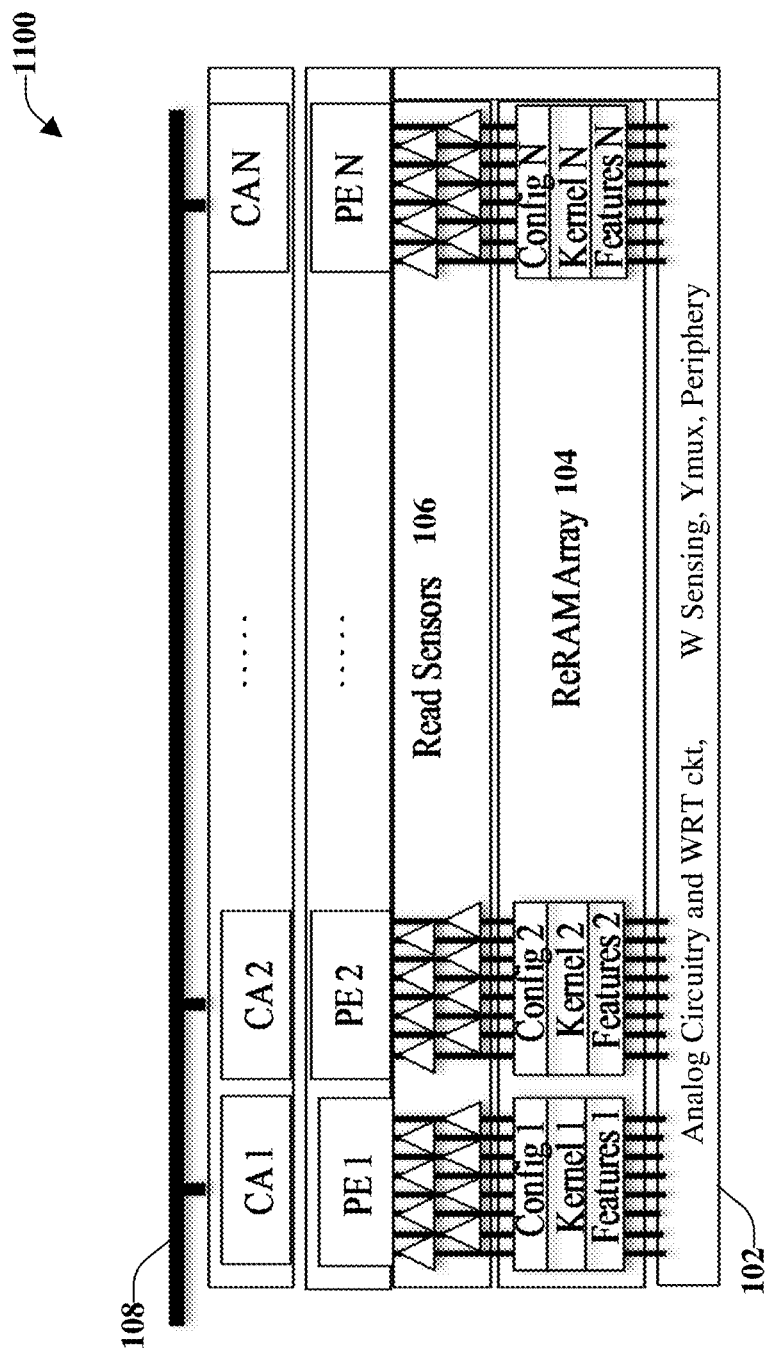
FIG. 12 illustrates a further example computing memory architecture according to an embodiment of the subject disclosure.

FIG. 12 illustrates an example computing memory architecture 1200 illustrating intercommunication among processing elements according to an embodiment of the subject disclosure. Repetitive description of like elements employed in other embodiments described herein is omitted for sake of brevity.

The processing elements of the computing memory architecture 1200 can communicate amongst themselves to select the processing element that comprises data that most closely matches a matching criteria. For example, in a case where the processing elements are comparing the input data with their associated feature data, the processing elements can communicate with one another to determine the winning processing element that matches the input the closest. The information from the winning processing element is the information reported to the host. Alternatively, the host reads the results from all the processing elements and the host selects the information to use based on a comparison of the resulting data received from all of the processing elements.

Figure 13:
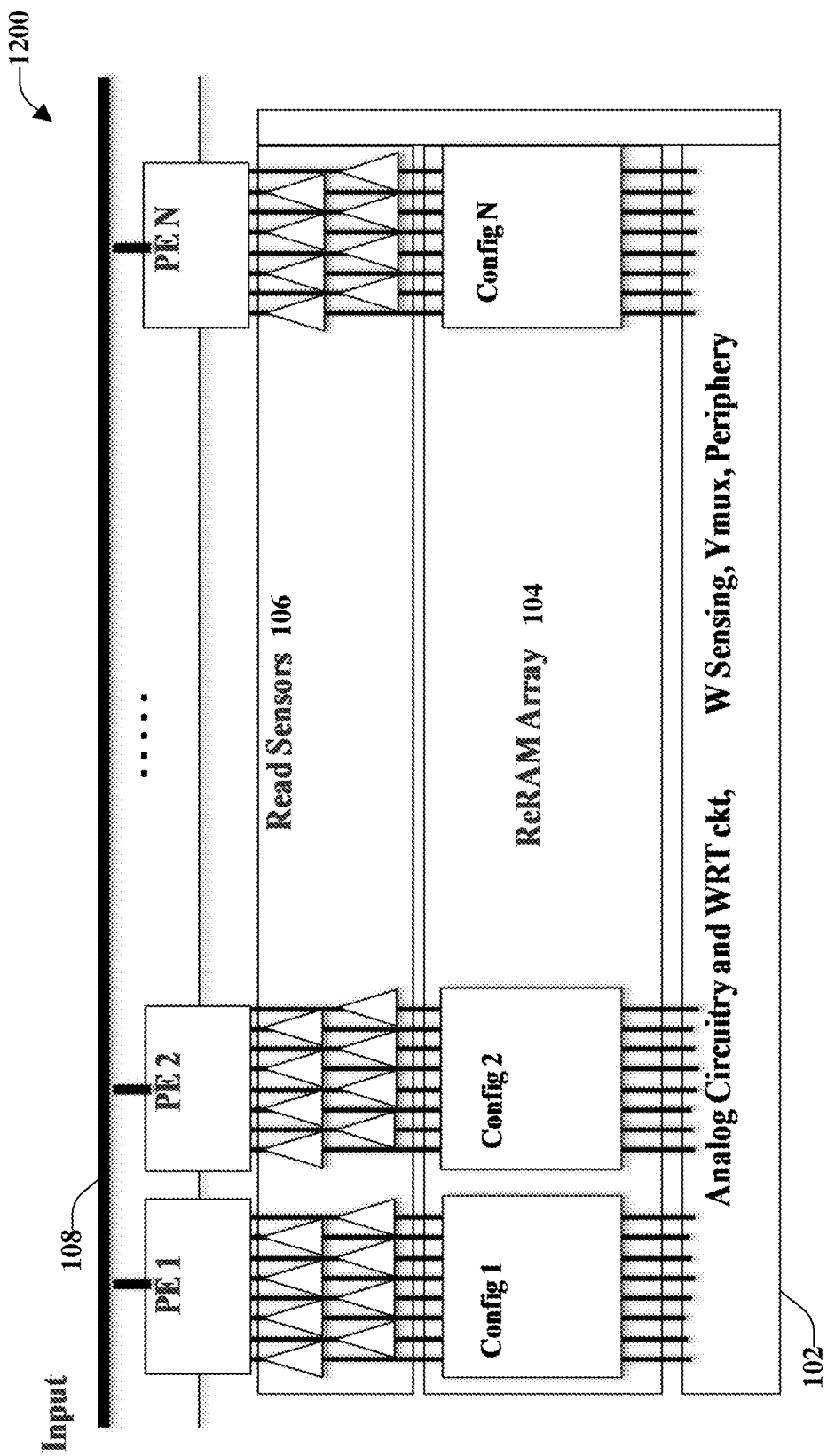
FIG. 13 illustrates an example computing memory architecture illustrating intercommunication among processing elements according to an embodiment of the subject disclosure.

FIG. 13 illustrates an example of multiple computing memory architectures cascaded in series according to an embodiment of the subject disclosure. Repetitive description of like elements employed in other embodiments described herein is omitted for sake of brevity.

As illustrated, a first computing memory architecture 1300 can be placed in series with a second computing memory architecture 1304 through an Nth computing memory architecture 1306. The illustrated computing memory architectures of FIG. 14 can be, for example, similar to the computing memory architecture 1200 of FIG. 13.

Figure 14:
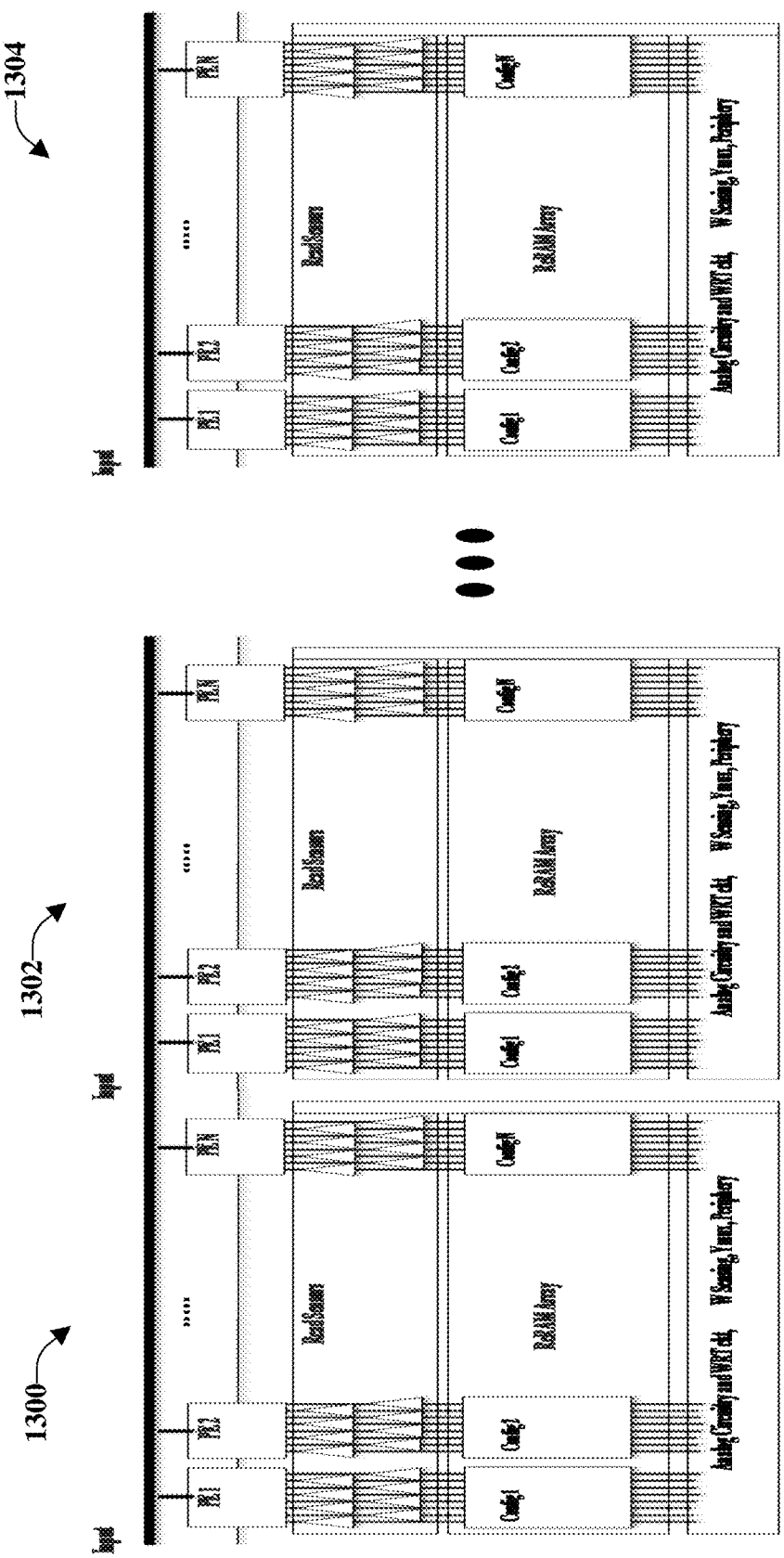
FIG. 14 illustrates an example of multiple computing memory architectures cascaded in series according to an embodiment of the subject disclosure.

Cascading the memory architectures in series can increase the number of processing elements according to an implementation. Further, intercommunication among the processing elements to select the processing element with information most closely matching a criteria can reduce the processing power needed by the host for searching for the best match. In addition, there can be more significant reduction of processing power when multiple computing memory architectures are cascaded together, as illustrated in FIG. 14.

Example Operating Environments

Figure 15:
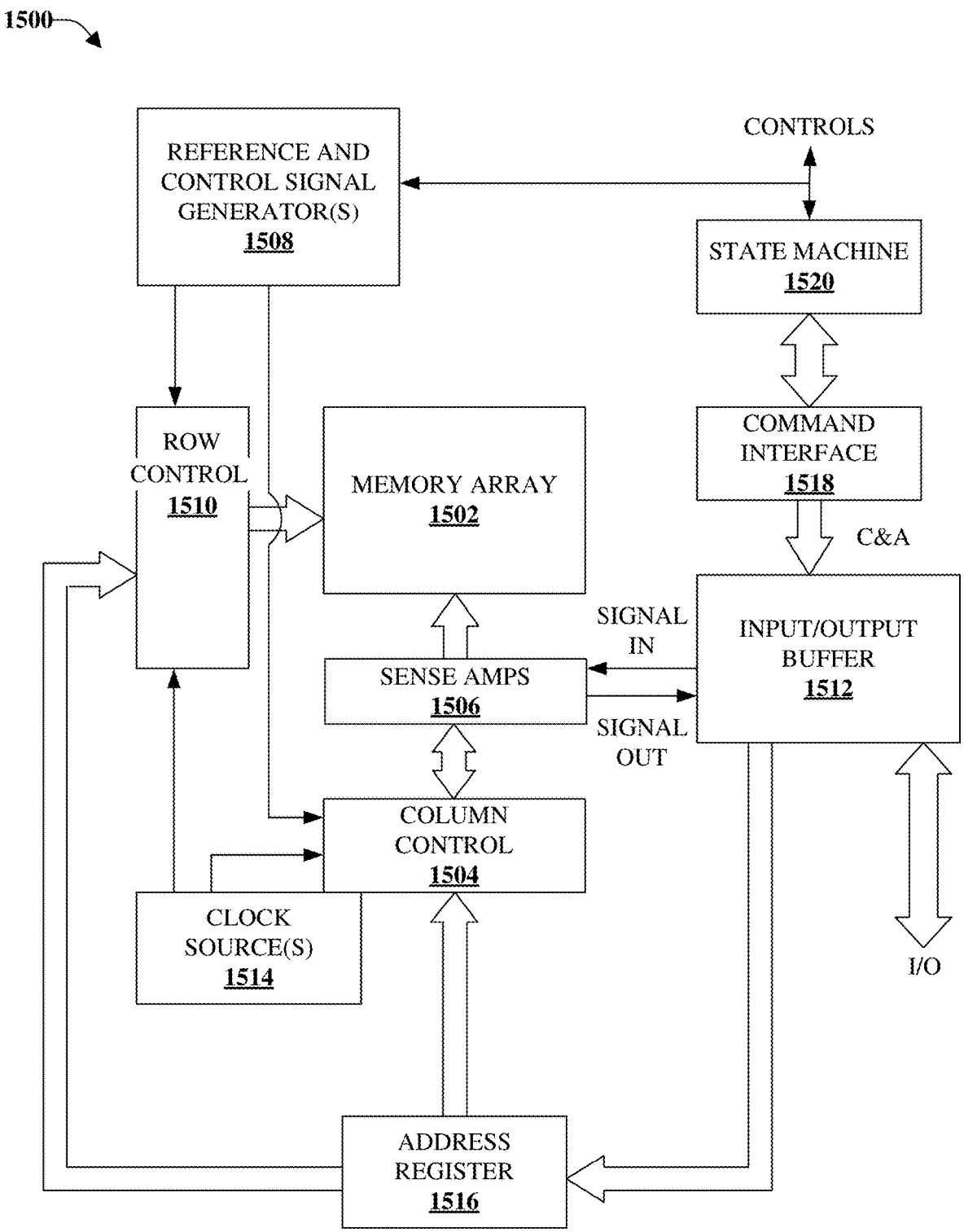
FIG. 15 illustrates a block diagram of an example electronic operating environment in accordance with certain embodiments of the subject disclosure.

In order to provide a context for the various aspects of the disclosed subject matter, FIG. 15, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects can also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory (e.g., CF card, USB memory stick, SD card, microSD card), or the like. In a distributed computing environment, program modules can be located in both local and remote memory storage modules or devices.

FIG. 15 illustrates a block diagram of an example operating and control environment 1500 for a memory array 1502 of a multi-bank memory cell array according to aspects of the subject disclosure. In at least one aspect of the subject disclosure, memory array 1502 can comprise memory selected from a variety of memory cell technologies. In at least one embodiment, memory array 1502 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing. In yet another embodiment, memory array 1502 can be configured to operate according to a read operation as provided herein.

A column controller 1504 and sense amps 1506 can be formed adjacent to memory array 1502. Moreover, column controller 1504 can be configured to activate (or identify for activation) a subset of bitlines of memory array 1502. Column controller 1504 can utilize a control signal provided by a reference and control signal generator(s) 1508 to activate, as well as operate upon, respective ones of the subset of bitlines, applying suitable program, erase or read voltages to those bitlines. Non-activated bitlines can be kept at an inhibit voltage (also applied by reference and control signal generator(s) 1508), to mitigate or avoid bit-disturb effects on these non-activated bitlines.

In addition, operating and control environment 1500 can comprise a row controller 1510. Row controller 1510 can be formed adjacent to and electrically connected with wordlines of memory array 1502. Further, utilizing control signals of reference and control signal generator(s) 1508, row controller 1510 can select particular rows of memory cells with a suitable selection voltage. Moreover, row controller 1510 can facilitate program, erase or read operations by applying suitable voltages at selected wordlines.

Sense amps 1506 can read data from, or write data to the activated memory cells of memory array 1502, which are selected by the column controller 1504 and the row controller 1510. Data read out from memory array 1502 can be provided to an input and input/output buffer 1512 (e.g., an LPDDR buffer, in some embodiments). Likewise, data to be written to memory array 1502 can be received from the input and input/output buffer 1512 and written to the activated memory cells of memory array 1502.

A clock source(s) 1514 can provide respective clock pulses to facilitate timing for read, write, and program operations of row controller 1510 and column controller 1504. Clock source(s) 1514 can further facilitate selection of wordlines or bitlines in response to external or internal commands received by operating and control environment 1500. Input and input/output buffer 1512 can comprise a command and address input, as well as a bidirectional data input and output. Instructions are provided over the command and address input, and the data to be written to memory array 1502 as well as data read from memory array 1502 is conveyed on the bidirectional data input and output, facilitating connection to an external host apparatus, such as a computer or other processing device (not depicted, but see e.g., computer 1602 of FIG. 17, below).

Input and input/output buffer 1512 can be configured to receive write data, receive an erase instruction, receive a status or maintenance instruction, output readout data, output status information, and receive address data and command data, as well as address data for respective instructions. Address data can be transferred to row controller 1510 and column controller 1504 by an address register 1516. In addition, input data is transmitted to memory array 1502 via signal input lines between sense amps 1506 and input and input/output buffer 1512, and output data is received from memory array 1502 via signal output lines from sense amps 1506 to input and input/output buffer 1512. Input data can be received from the host apparatus, and output data can be delivered to the host apparatus via the I/O bus.

Commands received from the host apparatus can be provided to a command interface 1518. Command interface 1518 can be configured to receive external control signals from the host apparatus, and determine whether data input to the input and input/output buffer 1512 is write data, a command, or an address. Input commands can be transferred to a state machine 1520.

State machine 1520 can be configured to manage programming and reprogramming of memory array 1502 (as well as other memory banks of the multi-bank memory array). Instructions provided to state machine 1520 are implemented according to control logic configurations, enabling state machine 1520 to manage read, write, erase, data input, data output, and other functionality associated with memory array 1502. In some aspects, state machine 1520 can send and receive acknowledgments and negative acknowledgments regarding successful receipt or execution of various commands. In further embodiments, state machine 1520 can decode and implement status-related commands, decode and implement configuration commands, and so on.

To implement read, write, erase, input, output, etc., functionality, state machine 1520 can control clock source(s) 1514 or reference and control signal generator(s) 1508. Control of clock source(s) 1514 can cause output pulses configured to facilitate row controller 1510 and column controller 1504 implementing the particular functionality. Output pulses can be transferred to selected bitlines by column controller 1504, for instance, or wordlines by row controller 1510, for instance.

Example Method for a Computing Memory Architecture

In view of the exemplary diagrams described above, process methods that can be implemented in accordance with the disclosed subject matter will be better appreciated with reference to flow charts. While for purposes of simplicity of explanation, the methods are shown and described as a series of blocks, it is to be understood and appreciated that the claimed subject matter is not limited by the order of the blocks, as some blocks can occur in different orders and/or concurrently with other blocks from what is depicted and described herein. Moreover, not all illustrated blocks can be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 16:
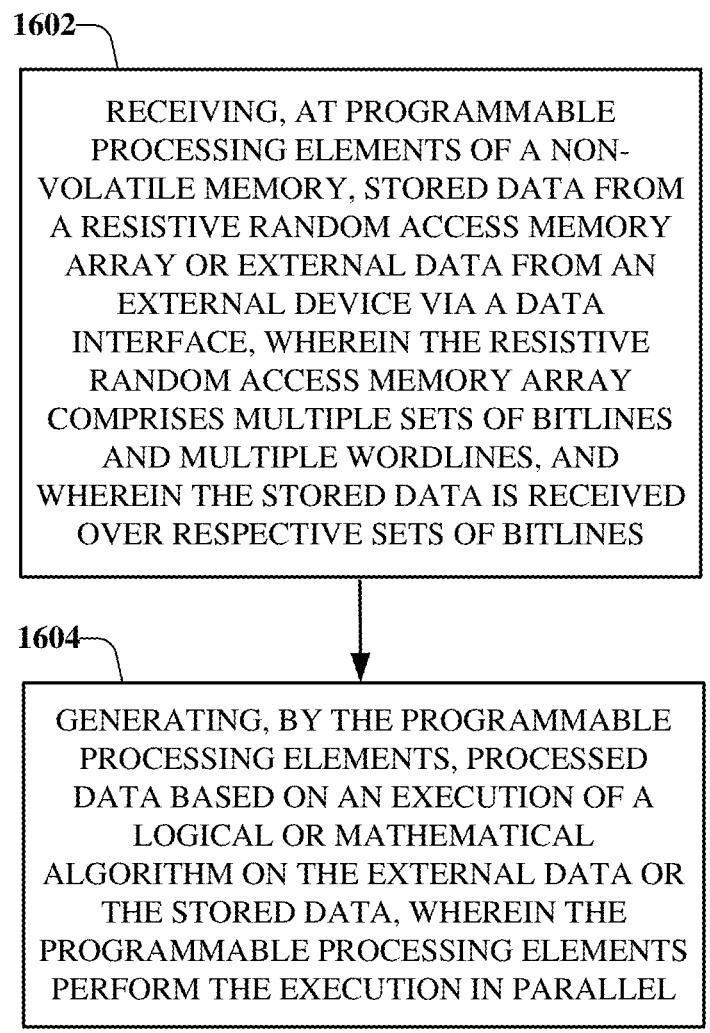
FIG. 16 illustrates a flowchart of an example method for operation of a non-volatile memory architecture in accordance with one or more embodiments provided herein.

FIG. 16 illustrates a flowchart of an example method 1600 for operation of a non-volatile memory architecture in accordance with one or more embodiments provided herein. The method 1600 starts, at 1602, with receipt, at programmable processing elements of a non-volatile memory, stored data from a resistive random access memory array or external data from an external device via a data interface. The resistive random access memory array can comprise multiple sets of bitlines and multiple wordlines. Further, the stored data can be received over respective sets of bitlines.

In some implementations, receiving the stored data from the resistive random access memory array can comprise receiving the stored data from correction code decoders. The correction code decoders can be associated with the programmable processing elements that can identify and correct an error bit in the stored data. Additionally or alternatively, receiving the stored data from the resistive random access memory array can comprise receiving a subset of the stored data based on an identification of the subset of the data by a wordline start pointer and a wordline stop pointer associated with the resistive random access memory array.

According to some implementations, the programmable processing elements are located between the data interface and the resistive random access memory array, and are physically connected with the multiple sets of bitlines of the resistive random access memory array. In accordance with some implementations, a first processing element of the programmable processing elements can be associated with a first set of the bitlines and a second processing element of the programmable processing elements can be associated with a second set of the bitlines. Further to this implementation, a first quantity of bitlines in the first set of the bitlines can be the same as a second quantity of the bitlines in the second set of the bitlines. Alternatively, a first quantity of bitlines in the first set of the bitlines can be different than a second quantity of the bitlines in the second set of the bitlines.

At 1604, the method can include generating, by the programmable processing elements, processed data based on an execution of a logical or mathematical algorithm on the external data or the stored data. The programmable processing elements can perform the execution in parallel, or substantially in parallel (e.g., a first programmable processing element can perform its respective execution at about the same time as a second programmable processing element performs its respective execution). According to an implementation, generating the processed data can comprise independently executing, by the programmable processing elements, the logical or mathematical algorithm on the external data or the stored data.

Figure 17:
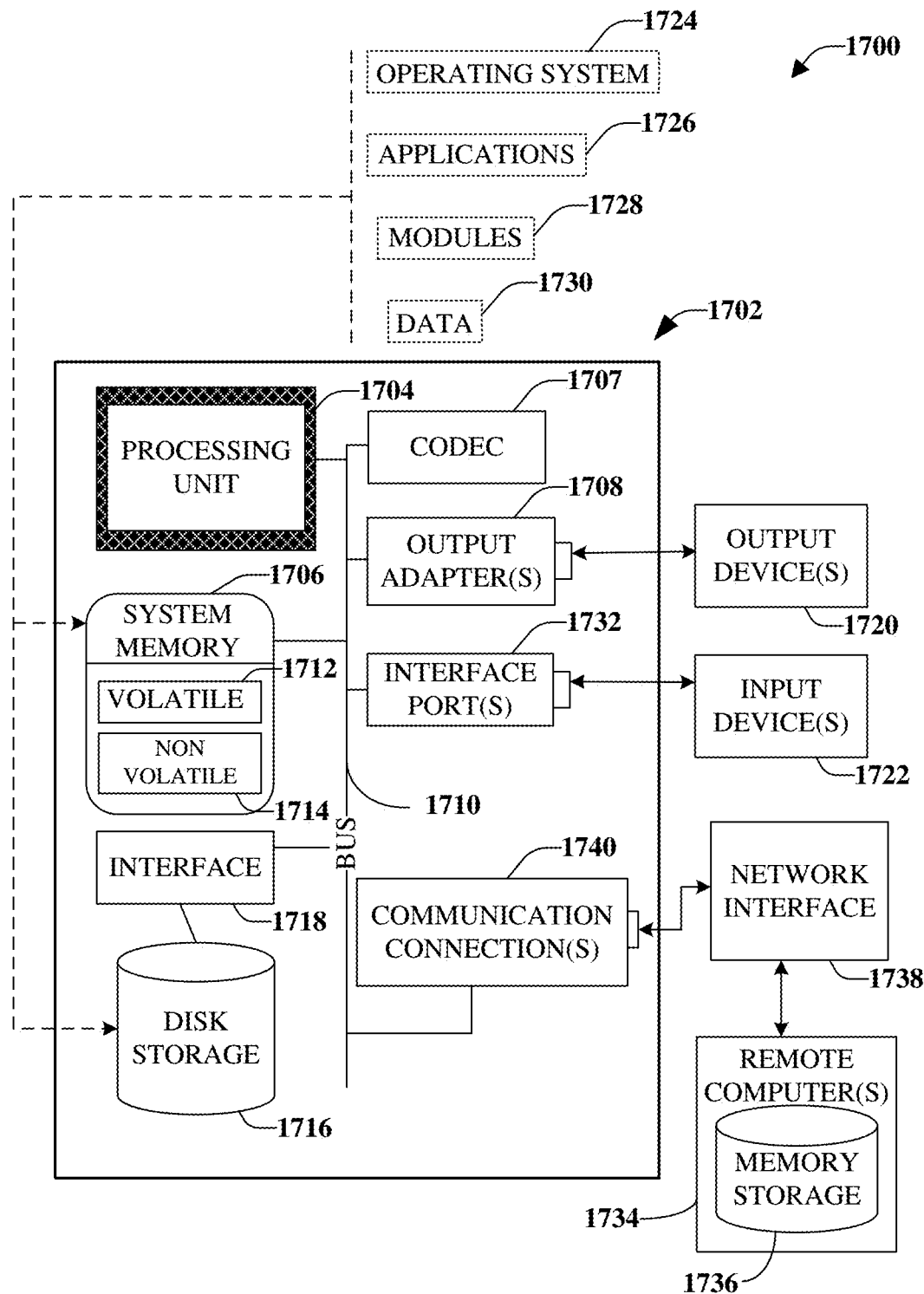
FIG. 17 depicts a block diagram of an example computing environment in accordance with certain embodiments of the subject disclosure.

With reference to FIG. 17, a suitable environment 1700 for implementing various aspects of the claimed subject matter includes a computer 1702. The computer 1702 includes a processing unit 1704, a system memory 1706, a codec 1707, and a system bus 1710. The system bus 1710 couples system components including, but not limited to, the system memory 1706 to the processing unit 1704. The processing unit 1704 can be any of various available processors. Dual microprocessors and other multiprocessor architectures also can be employed as the processing unit 1704.

The system bus 1710 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1706 includes volatile memory 1712 and non-volatile memory 1714. The basic input/output system (BIOS), containing the basic routines to transfer information between elements within the computer 1702, such as during start-up, is stored in non-volatile memory 1714. In addition, according to present innovations, codec 1707 can include at least one of an encoder or decoder, wherein the at least one of an encoder or decoder can consist of hardware, software, or a combination of hardware and software. Although, codec 1707 is depicted as a separate component, codec 1707 can be contained within non-volatile memory 1714. By way of illustration, and not limitation, non-volatile memory 1714 can include read only memory (ROM), programmable ROM (PROM), electrically programmable ROM (EPROM), electrically erasable programmable ROM (EEPROM), or flash memory. Volatile memory 1712 includes random access memory (RAM), which acts as external cache memory. According to present aspects, the volatile memory can store the write operation retry logic (not shown in FIG. 17) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 1702 can also include removable/non-removable, volatile/non-volatile computer storage medium. FIG. 17 illustrates, for example, disk storage device 1716. Disk storage device 1716 includes, but is not limited to, devices like a magnetic disk drive, solid state disk (SSD) floppy disk drive, tape drive, Jaz drive, Zip drive, LS-100 drive, flash memory card, or memory stick. In addition, disk storage device 1716 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage device 1716 to the system bus 1710, a removable or non-removable interface is typically used, such as interface 1718. It is appreciated that the disk storage device 1716 can store information related to a user. Such information might be stored at or provided to a server or to an application running on a user device. In one embodiment, the user can be notified (e.g., by way of output device(s) 1736) of the types of information that are stored to disk storage device 1716 and/or transmitted to the server or application. The user can be provided the opportunity to opt-in or opt-out of having such information collected and/or shared with the server or application (e.g., by way of input from input device(s) 1722).

It is to be appreciated that FIG. 17 describes software that acts as an intermediary between users and the basic computer resources described in the suitable operating environment 1700. Such software includes an operating system 1724. Operating system 1724, which can be stored on disk storage device 1716, acts to control and allocate resources of the computer system 1702. Applications 1726 take advantage of the management of resources by operating system 1724 through program modules 1728, and program data 1730, such as the boot/shutdown transaction table and the like, stored either in system memory 1706 or on disk storage device 1716. It is to be appreciated that the claimed subject matter can be implemented with various operating systems or combinations of operating systems.

A user enters commands or information into the computer 1702 through input device(s) 1722. Input devices 1722 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1704 through the system bus 1710 via interface port(s) 1732. Interface port(s) 1732 include, for example, a serial port, a parallel port, a game port, and a universal serial bus (USB). Output device(s) 1720 use some of the same type of ports as input device(s) 1722. Thus, for example, a USB port can be used to provide input to computer 1702 and to output information from computer 1702 to an output device 1720. Output adapter 1708 is provided to illustrate that there are some output devices 1720 such as monitors, speakers, and printers, among other output devices 1720, which require special adapters. The output adapters 1708 include, by way of illustration and not limitation, video and sound cards that provide a means of connection between the output device 1720 and the system bus 1710. It should be noted that other devices and/or systems of devices provide both input and output capabilities such as remote computer(s) 1734.

Computer 1702 can operate in a networked environment using logical connections to one or more remote computers, such as remote computer(s) 1734. The remote computer(s) 1734 can be a personal computer, a server, a router, a network PC, a workstation, a microprocessor based appliance, a peer device, a smart phone, a tablet, or other network node, and typically includes many of the elements described relative to computer 1702. For purposes of brevity, only a memory storage device 1736 is illustrated with remote computer(s) 1734. Remote computer(s) 1734 is logically connected to computer 1702 through a network interface 1738 and then connected via communication connection(s) 1740. Network interface 1738 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1740 refers to the hardware/software employed to connect the network interface 1738 to the system bus 1710. While communication connection 1740 is shown for illustrative clarity inside computer 1702, it can also be external to computer 1702. The hardware/software necessary for connection to the network interface 1738 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure can also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips ..."), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature can have been disclosed with respect to only one of several implementations, such feature can be combined with one or more other features of the other implementations as can be desired and advantageous for any given or particular application. It will also be recognized that the embodiments include a system as well as a computer-readable medium having computer-executable instructions for performing the acts and/or events of the various processes.

What is claimed is:

1. A non-volatile memory, comprising:
a two-terminal memory array comprising multiple bitlines and multiple wordlines;
a first data interface comprising a first number of input/output (I/O) lines for receiving first data from an external device and writing the first data to the memory array, and for outputting second data from the memory array to the external device; and
a second data interface comprising a second number of output lines for outputting third data from the memory array to the external device independently of the first data interface, wherein the second number of output lines is larger than the first number of I/O lines,
wherein the first data interface further comprises a multiplexer physically connected to a group of the multiple bitlines.

2. The non-volatile memory of claim 1, wherein the first number of I/O lines are logical lines connected to the multiplexer and indirectly connected to addressable subsets of the group of the multiple bitlines by way of the multiplexer.

3. The non-volatile memory of claim 1, wherein the second number of output lines are physical lines physically connected to a group of the multiple bitlines.

4. The non-volatile memory of claim 3, wherein the second number of output lines is equivalent to a number of the multiple bitlines, and each output line is respectively connected to one bitline of the multiple bitlines.

5. The non-volatile memory of claim 1, wherein the first data interface further comprises a read/write sense amp and the second data interface further comprises a read-only sense amp.

6. The non-volatile memory of claim 5, wherein the read/write sense amp is coupled indirectly to a selectable bitline of the multiple bitlines by way of a multiplexer of the first data interface, and the read/write sense amp is configured to receive a bit of the first data for writing to a memory cell of the memory array connected to the selectable bitline, and to receive a bit of the second data from the memory cell connected to the selectable bitline for outputting from the memory array.

7. The non-volatile memory of claim 5, wherein the read-only sense amp is fixedly connected to one bitline of the multiple bitlines and is configured to receive a bit of the third data from a memory cell of the memory array connected to the one bitline.

8. The non-volatile memory of claim 1, further comprising a programmable processing element (PPE) connected to a third plurality of the multiple bitlines and configured to receive a set of data, execute an algorithm on the set of data to generate processed data different from the set of data.

9. The non-volatile memory of claim 8, wherein the PPE is one of: connected to the first data interface and the first number of I/O lines or connected to the second data interface and a plurality of output lines of the second number of output lines.

10. A non-volatile memory architecture, comprising:
a two-terminal memory array comprising multiple bitlines and multiple wordlines;
a first data interface including a multiplexer that is physically coupled to a first plurality of the multiple bitlines, wherein the first data interface is configured for receiving first data from an external device and writing the first data to the memory array, and for reading second data from the memory array and outputting the second data to the external device, the first data interface having a first data throughput; and
a second data interface physically coupled to a second plurality of the multiple bitlines, larger than the first plurality of the multiple bitlines, for outputting third data from the memory array independently of the first data interface, the second data interface having a second data throughput different than the first data throughput.

11. The non-volatile memory architecture of claim 10, wherein the second data throughput is larger than the first data throughput.

12. The non-volatile memory architecture of claim 10, wherein the first data interface is a logical interface indirectly connecting a logical input/output (I/O) line to the first plurality of the multiple bitlines by way of the multiplexer, and wherein the second data interface is a physical interface that connects a physical data line to a bitline of the second plurality of the multiple bitlines.

13. The non-volatile memory architecture of claim 12, wherein the second plurality of the multiple bitlines includes all bitlines of the multiple bitlines.

14. The non-volatile memory architecture of claim 10, wherein the first data interface further comprises a read/write sense amp and a logical I/O line connected to the multiplexer, wherein the read/write sense amp and the logical I/O line are not utilized for outputting the third data from the memory array.

15. The non-volatile memory architecture of claim 10, wherein the second data interface further comprises a read-only sense amp and a physical data line connected to a bitline of the second plurality of the multiple bitlines, wherein the read-only sense amp and the physical data line are not utilized for writing the first data to the memory array or for reading the second data from the memory array.

16. The non-volatile memory architecture of claim 10, further comprising a programmable processing element (PPE) connected to a third plurality of the multiple bitlines and configured to receive a set of data and output a second set of data different from the set of data.

17. The non-volatile memory architecture of claim 16, wherein the PPE is connected to a group of physical data lines of the second data interface and the set of data comprises at least a portion of the third data output from the memory array.

18. The non-volatile memory architecture of claim 16, wherein the PPE is connected to a group of logical I/O lines of the first data interface and at least one of the following:
the set of data comprises a portion of the first data received from the external device and the PPE is configured to generate the second set of data from the first data, which second set of data is then written to the memory array; or
the set of data comprises a portion of the second data read from the memory array and the PPE is configured to generate the second set of data from the second data, which second set of data is then output to the external device.

19. The non-volatile memory architecture of claim 16, wherein the two-terminal memory array comprises a wordline start pointer and a wordline stop pointer, and wherein the wordline start pointer and the wordline stop pointer are configured to identify the set of data, and facilitate transfer of only the set of data from the memory array to the programmable processing elements.

* * * * *